United States Patent
Grimbergen et al.

(10) Patent No.: US 6,390,019 B1
(45) Date of Patent: *May 21, 2002

(54) CHAMBER HAVING IMPROVED PROCESS MONITORING WINDOW

(75) Inventors: Michael N. Grimbergen, Redwood City; Xue-Yu Qian, San Jose, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/096,728

(22) Filed: Jun. 11, 1998

(51) Int. Cl.$^7$ ............................................. C23C 16/00
(52) U.S. Cl. ......................... 118/723 R; 118/723 I; 118/723 E; 118/723 MW; 118/712; 118/713; 156/345
(58) Field of Search .................. 118/723 R, 723 I, 118/723 IR, 723 E, 723 MW, 712, 713; 156/345

(56) References Cited

U.S. PATENT DOCUMENTS

| | | | | |
|---|---|---|---|---|
| 3,170,383 A | * | 2/1965 | Hunt | ......................... 454/370 |
| 3,316,468 A | * | 4/1967 | Hanks | ......................... 361/233 |

(List continued on next page.)

FOREIGN PATENT DOCUMENTS

| | | |
|---|---|---|
| EP | 0607797 | 7/1994 |
| EP | 0735565 | 2/1996 |
| EP | 0756318 | 1/1997 |
| EP | 0788138 | 8/1997 |
| EP | 0801413 | 10/1997 |
| EP | 0908922 | 4/1999 |
| JP | 61160926 | 7/1986 |
| JP | 63-253617 | * 10/1988 |
| JP | 03015198 | 1/1991 |
| JP | 7280020 | 5/1997 |
| WO | WO9844535 | 10/1998 |
| WO | WO9848444 | 10/1998 |
| WO | WO9914791 | 3/1999 |

OTHER PUBLICATIONS

Stevens, et al. "Helicon plasma source excited by a flat spiral coil", J. Vac. Sci. Technol. A 13(5), Sep./Oct. 1995.
International Search Report, dated Feb. 17, 1999.
Principles of Instrumental Analysis, $2^{nd}$ Ed., Skoog and West (Saunders, 1980) pp. 181,182,193,245.
Sofie Instruments—Product User's Manual, Digitwin.
"In–Situ Control and Diagnosis of Deposition and Etch Processes is Possible Using Interferometry Combined with CCD Imaging." European SemiConductor, Mar. 1995, pp. 14–17.
F. Heinrich, P. Kopperschmidt, "Online Uniformity Measurements in Large Area Plasma Assisted Etching and Deposition", Proceedings of the $10^{th}$ International Colloquium on Plasma Processes CIP '95. Antibes, France, Jun. 11–15, 1995.
PCT Search Report dated Sep. 15, 1999.

Primary Examiner—Jeffrie R. Lund
(74) Attorney, Agent, or Firm—Janah and Associates

(57) ABSTRACT

A process chamber 35 for processing a substrate 30 and monitoring the process conducted on the substrate 30, comprises a support 45, a gas distributor, and an exhaust 85. The process chamber 35 has a wall comprising a window 130 that allows light to be transmitted therethrough and reduces deposition of process residue from the process gas onto the window 130 during processing of the substrate 30. In one version, the window 130 comprises a transparent plate 135 covered by an overlying mask 140 that has at least one aperture 145 extending through the mask 140 so that light can be transmitted through the aperture 145 and the transparent plate 135.

66 Claims, 8 Drawing Sheets

U.S. PATENT DOCUMENTS

| | | | | |
|---|---|---|---|---|
| 3,514,391 A | | 5/1970 | Hablanian et al. ........... 204/298 |
| 4,037,945 A | * | 7/1977 | Wollam ....................... 350/319 |
| 4,198,261 A | | 4/1980 | Busta et al. ................. 156/626 |
| 4,208,240 A | | 6/1980 | Latos .......................... 156/627 |
| 4,493,745 A | | 1/1985 | Chen et al. ................. 156/626 |
| 4,842,683 A | | 6/1989 | Cheng et al. ............... 156/345 |
| 4,859,277 A | | 8/1989 | Barna et al. ................ 156/626 |
| 4,913,928 A | * | 4/1990 | Sugita et al. ................. 427/39 |
| 4,953,982 A | | 9/1990 | Ebbing et al. .............. 356/357 |
| 4,975,141 A | | 12/1990 | Greco et al. ................ 156/626 |
| 5,002,631 A | | 3/1991 | Giapis et al. ............... 156/643 |
| 5,074,985 A | * | 12/1991 | Tamura et al. ......... 204/298.11 |
| 5,129,994 A | | 7/1992 | Ebbing et al. .............. 156/643 |
| 5,200,023 A | | 4/1993 | Gifford et al. .............. 156/626 |
| 5,277,746 A | * | 1/1994 | Anderson ................... 156/603 |
| 5,290,383 A | | 3/1994 | Koshimizu .................. 156/345 |
| 5,308,414 A | | 5/1994 | O'Neill ...................... 156/626 |
| 5,362,356 A | | 11/1994 | Schoenborn ................ 156/626 |
| 5,370,765 A | * | 12/1994 | Dandl ........................ 156/345 |
| 5,372,673 A | | 12/1994 | Stager et al. ............... 156/626 |
| 5,392,124 A | | 2/1995 | Barbee et al. .............. 356/381 |
| 5,399,229 A | | 3/1995 | Stefani et al. .............. 156/626 |
| 5,403,433 A | | 4/1995 | Morrison et al. ........... 156/626 |
| 5,406,080 A | | 4/1995 | Friedheim ................... 250/309 |
| 5,445,705 A | | 8/1995 | Barbee et al. ........... 156/677.1 |
| 5,450,205 A | | 9/1995 | Sawin et al. ................ 356/382 |
| 5,451,289 A | | 9/1995 | Barbee et al. ................ 216/59 |
| 5,456,788 A | | 10/1995 | Barbee et al. .............. 156/345 |
| 5,467,883 A | | 11/1995 | Frye et al. ..................... 216/60 |
| 5,472,508 A | | 12/1995 | Saxena .................... 118/723 E |
| 5,531,862 A | * | 7/1996 | Otsubo et al. ............ 156/643.1 |
| 5,536,359 A | | 7/1996 | Kawada et al. ............ 156/626.1 |
| 5,587,038 A | | 12/1996 | Cecchi et al. ................ 156/345 |
| 5,622,635 A | | 4/1997 | Cuomo et al. ................. 216/68 |
| 5,648,701 A | | 7/1997 | Hooke et al. ........... 315/111.21 |
| 5,654,903 A | | 8/1997 | Reitman et al. ....... 364/551.01 |
| 5,686,796 A | | 11/1997 | Boswell et al. ......... 315/111.21 |
| 5,691,540 A | | 11/1997 | Halle et al. ................. 250/372 |
| 5,716,451 A | | 2/1998 | Hama et al. ................ 118/723 |
| 5,738,756 A | | 4/1998 | Liu .......................... 156/627.1 |
| 5,747,380 A | | 5/1998 | Yu et al. ..................... 438/599 |
| 5,748,297 A | | 5/1998 | Suk et al. |
| 5,767,628 A | | 6/1998 | Keller et al. ............ 315/111.51 |
| 5,770,097 A | | 6/1998 | O'Neill et al. ................. 216/60 |
| 5,772,772 A | * | 6/1998 | Chi .................... 118/723 MA |
| 5,792,272 A | | 8/1998 | Van Os et al. .......... 118/723 IR |
| 5,800,688 A | | 9/1998 | Lantsman et al. ..... 204/298.11 |
| 5,804,046 A | | 9/1998 | Sawada et al. ........ 204/298.11 |
| 5,807,761 A | | 9/1998 | Coronel et al. ............... 438/14 |
| 5,834,375 A | | 11/1998 | Chen .......................... 438/692 |
| 5,837,057 A | | 11/1998 | Koyama et al. ...... 118/723 VE |
| 5,846,883 A | | 12/1998 | Moslehi ..................... 438/711 |
| 5,858,259 A | * | 1/1999 | Hirose et al. ................. 216/70 |
| 6,006,694 A | * | 12/1999 | DeOrnellas et al. ...... 118/723 I |
| 6,085,688 A | | 7/2000 | Lymberopoulos et al. ....................... 118/723 I |

\* cited by examiner

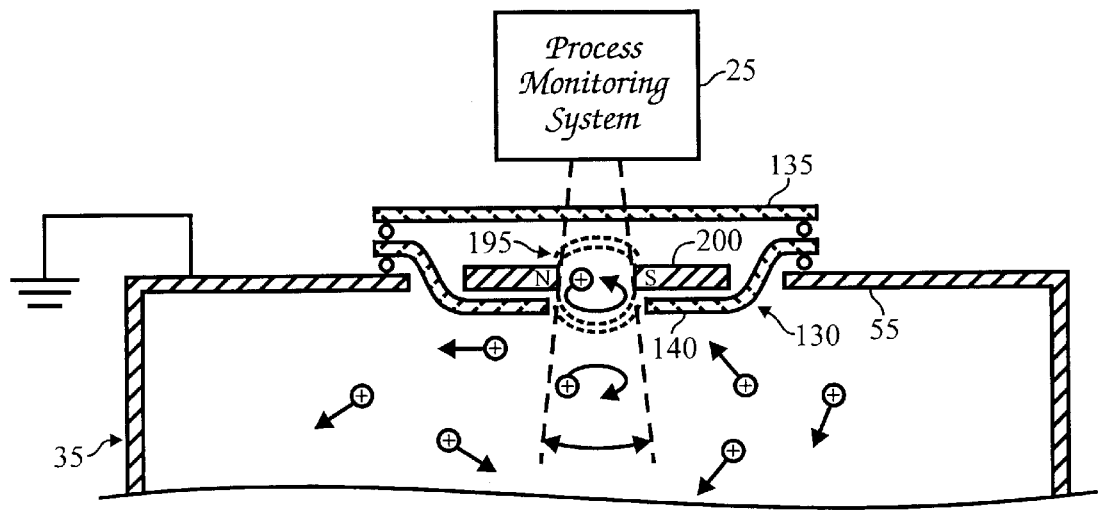
Fig. 6a
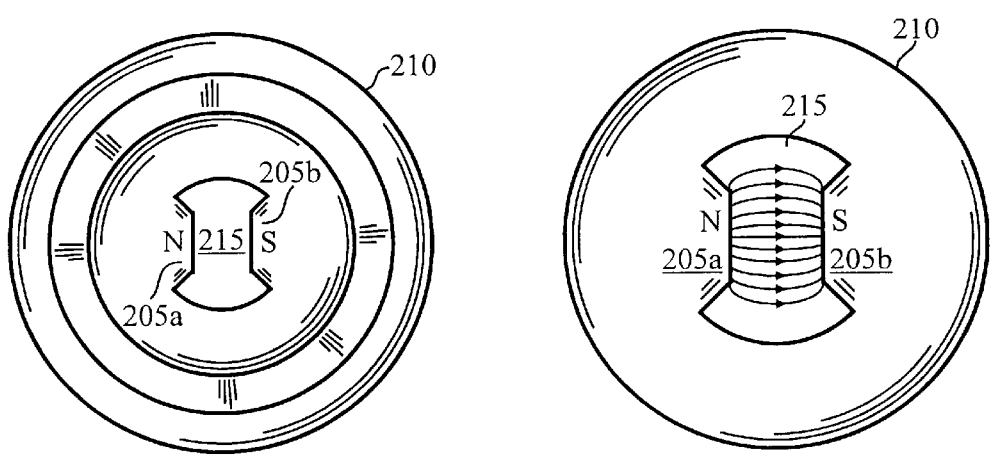
Fig. 6b
Fig. 6c
Fig. 6d

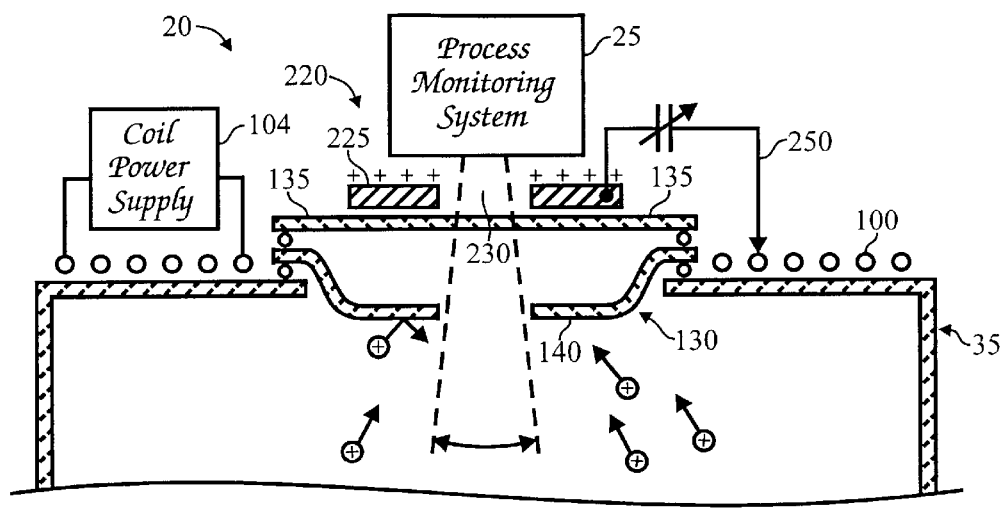
Fig. 8a
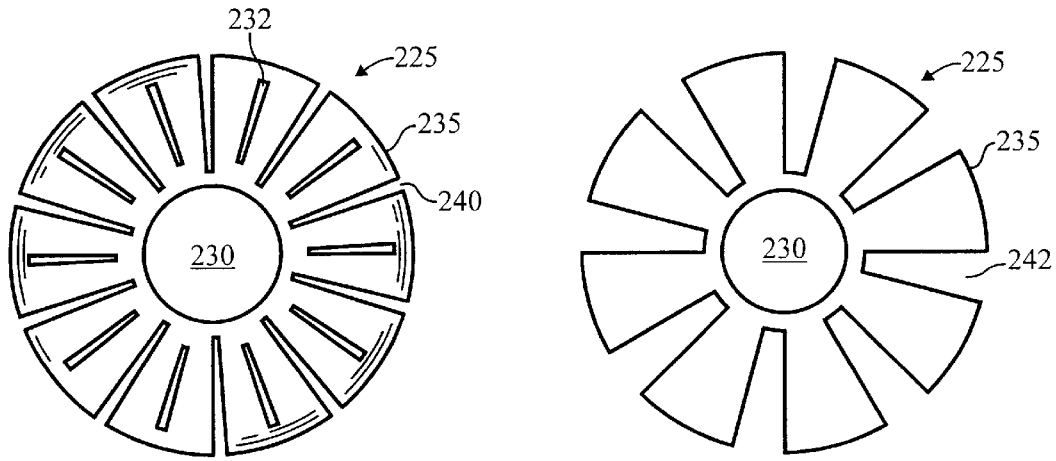
Fig. 8b
Fig. 8c
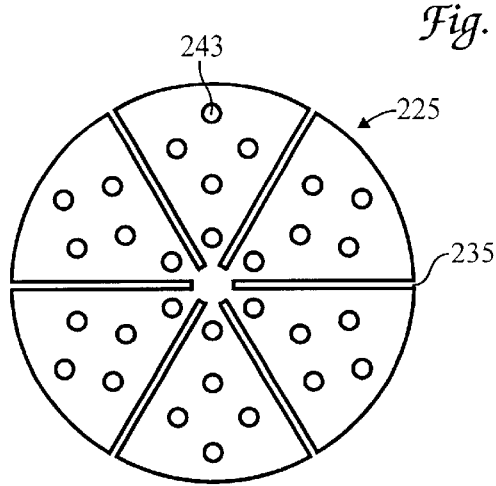
Fig. 8d

CHAMBER HAVING IMPROVED PROCESS MONITORING WINDOW

BACKGROUND

The present invention relates to a process chamber and process monitoring window.

In integrated circuit fabrication, layers of semiconductor, dielectric, and conductor materials, such as for example, polysilicon, silicon dioxide, aluminum and copper layers are deposited on a substrate and subsequently processed, for example, by etching with an etchant plasma, to form active devices. The layers are deposited on the substrate in a process chamber by processes such as chemical vapor deposition (CVD), physical vapor deposition (PVD), thermal oxidation, ion implantation and ion diffusion. After deposition, a resist layer of photoresist or hard mask is applied on the deposited layer and patterned by photolithography. Portions of the deposited layers lying between the resist features are etched using RF or microwave energized halogen and other reactive gases to form etched features.

In these fabrication processes, it is often desirable to monitor in-situ the process being performed on the substrate by a process monitoring system. For example, in CVD and PVD processes, it is desirable to stop the deposition process after a desired thickness of a layer is deposited. In etching processes, endpoint detection methods are used to prevent overetching of layers that are being etched. Typical process monitoring methods, include for example, plasma emission analysis, ellipsometry, and interferometry. In plasma emission analysis, an emission spectra of a plasma is measured to determine a change in chemical composition that corresponds to a change in the layer being processed, as for example, taught in U.S. Pat. No. 4,328,068 which is incorporated herein by reference. In ellipsometry, a polarized light beam is reflected off a layer on the substrate and analyzed to determine a phase shift and a change in magnitude of the reflected light that occurs with changes in the thickness of the layer, as for example disclosed in U.S. Pat. Nos. 3,874,797 and 3,824,017, both of which are incorporated herein by reference. In interferometry, a non-polarized light beam is reflected off the layer and analyzed to determine a change in magnitude of the reflected light that occurs due to interference of reflected light components from the top and bottom surfaces of the layer on the substrate, as for example, described in U.S. Pat. No. 4,953,982, issued Sep. 4, 1990, which is incorporated herein by reference. These process monitoring methods require a high strength optical transmission signal through the window and also require viewing or signal sampling of relatively large surface area of the substrate.

A typical process monitoring system comprises an optical sensor system for detecting and measuring light emissions or light reflections through a window in a wall of the process chamber. The window is transparent to particular light wavelengths to allow light to be transmitted in and out of the chamber while maintaining a vacuum seal with the chamber. When monitoring a layer on a substrate, the transparent window is positioned in the chamber wall in direct line of sight of the substrate. Process monitoring windows are typically constructed from quartz which is resistant to high temperatures and are sealed to the chamber surface with O-ring seals positioned along their edges.

However, in many deposition and etching processes, a thin cloudy film of residue deposits and byproducts are deposited on the process monitoring window as substrates are being processed in the chamber. The process residues are deposited on the window at rates often in excess of 1 micron in 25 to 50 hours of process operation. The deposited film of process residue changes the properties or intensity of the light transmissions passing through the window. For example, in plasma emission analysis, the residue deposits selectively filter out particular wavelengths of light from the optical emission spectra of the plasma resulting in errors in process monitoring measurements. In ellipsometry, the residue deposits change the state of polarization of the light beam transmitted or reflected through the window causing erroneous ellipsometric measurements. As another example, in interferometry, the deposits absorb and lower the intensity of the light passing through the window resulting in a lower signal-to-noise ratio.

To avoid these problems, conventional processing monitoring windows are periodically replaced or cleaned to remove the residue deposits formed on the windows. For example, in typical etching processes, after etching a certain number of wafers, or operating cumulatively for about 10 hours, the chamber is opened to the atmosphere and cleaned in a "wet-cleaning" process, in which an operator uses an acid or solvent to scrub off and dissolve the deposits accumulated on the window and chamber walls. After cleaning, the chamber is pumped down for 2 to 3 hours to outgas volatile acid or solvent species, and a series of etching runs are performed on dummy wafers. In the competitive semiconductor industry, the downtime of the chamber during such cleaning processes can substantially reduce process throughput and increase processing costs per substrate. Also, manually performed wet cleaning processes are often hazardous, and the quality of cleaning varies from one session to another.

One approach to solving the residue deposition problem uses a recessed window positioned in a long tube that opens into the chamber. Because the process gas or plasma in the chamber has to travel though the length of the tube before reaching the recessed window, the deposition of process residues on the surface of the recessed window inside the tube is markedly reduced. However, the high aspect ratio (length/diameter) of the elongated tube makes it difficult to monitor a sufficiently large sampling area inside the chamber, and reduces the total light flux. This limits the accuracy of the process monitoring systems during processing of a batch of substrates or sometimes even for a single substrate. In addition, the elongated tube takes up a large amount of space outside the chamber, which is undesirable in tight clean room spaces, and the tube is also difficult to fit in-between other components of the process chamber.

In another solution, the process monitoring window is selectively heated to prevent deposition of process residue deposits, as described in commonly assigned U.S. Pat. No. 5,129,994, to Ebbing et al., issued on Jul. 14, 1992. However, while suitable for certain types of processes, heating does not prevent all forms of residues from condensing and depositing on the window, and in certain processes, heating can actually increase the rate of deposition of process residue on the window.

In yet another approach, photosensitive equipment is used to sample signals of the light emissions or reflections from the chamber/substrate and mathematically manipulate the sampled data to increase the signal to noise ratio of the light signal passing through a cloudy window, as for example, described in U.S. Pat. No. 5,738,756 to Liu, issued on Apr. 14, 1998. However, complex mathematical manipulations can delay process response times. In etching processes, even a small time delay can result in undesirable charging or lattice damage of the underlying layers, especially for underlying polysilicon layers. In addition, these processes are not always able to increase the signal to noise ratio by a sufficient amount to provide a discernible signal. If the signal is too small, the fabrication process may never be terminated, and if it is too large, the process may be prematurely terminated.

The process residues deposited on windows are a particular problem when monitoring etching processes in which etching of a thick overlayer has to be stopped before etching through a relatively thin underlayer. For example, the aggressive halogen containing gases etchant gases that are used to etch a relatively thick layer will often uncontrollably etch through or damage any thin underlayers, without an accurate and reliable process monitoring system. This is especially a problem when etching a polysilicon overlayer to expose a thin gate oxide underlayer. After the polysilicon etching process, it is desirable for the remaining thickness of the gate oxide layer to be very close to a nominal and predetermined thickness. As the gate oxide layer becomes thinner, it is more difficult to accurately etch through the polysilicon overlayer without overetching into the gate oxide layer. It is further desirable to stop the etching process on the gate oxide layer without causing charge or lattice damage to underlying silicon by exposed the silicon to the energetic etchant plasma. This type of process control is only possible with a reliable and consistently performing process monitoring system.

Thus it is desirable to have a chamber and process monitoring system that allows monitoring of processing of substrates in the chamber, without excessive signal loss during continued processing of the substrate. It is further desirable to have a process monitoring window that prevents or reduces deposition of process residue on its surfaces and exhibits a low rate of erosion in reactive halogen gases and plasmas. It is also desirable to have a method of monitoring processing of a substrate that provides accurate and repeatable processing results, especially for etching thick overlayers on thin underlayers.

SUMMARY

The present invention provides a process chamber for processing a substrate and monitoring the process being conducted on the substrate with a high degree of accuracy and repeatability. The chamber comprises a support, a process gas distributor, and an exhaust system. The chamber has a wall comprising a window that allows light to be transmitted therethrough. The window comprises a transparent plate covered by a mask having at least one aperture extending through the mask so that light can be transmitted through the aperture of the mask and the transparent plate to monitor the process being conducted on the substrate. The mask covering the transparent plate reduces deposition of process gas byproducts and other deposits on the window during a process in which a substrate is held on the support and processed by process gas that is distributed by the gas distributor and is exhausted by the exhaust system.

In another aspect, the present invention comprises a process chamber comprising a support having a receiving surface that is adapted to support a substrate. A gas distributor provides process gas in the process chamber to process the substrate and form process gas byproducts. First means are provided for transmitting light into and from the process chamber during processing of a substrate in the process chamber. Second means are provided for masking the first means to reduce deposition of process gas byproducts formed in the process chamber. An exhaust comprising pumps exhaust the process gas and process gas byproducts from the process chamber.

In yet another aspect, the present invention comprises a method of processing a substrate, comprising the steps of placing the substrate in a process zone and maintaining first process conditions in the process chamber to process the substrate, the first process conditions including providing an energized process gas to the process zone. An incident light beam is directed through a window adjacent to the process zone to be incident on the substrate. A measurable intensity of the reflected light beam passing through the window is measured by holding a mask having apertures against the window to reduce deposition of process gas byproducts on the window. A property of a reflected light beam that is reflected from the substrate is measured. The first process conditions are changed to second process conditions in relation to the measurement of the property of the reflected light beam.

In another aspect, the present invention comprises a method of etching a layer on a substrate substantially without etching or damaging an underlayer. The method comprises the steps of placing the substrate in a process zone and maintaining process conditions in the process zone to etch a layer on the substrate and form process gas byproducts, the process conditions comprising one or more of process gas composition and flow rates, power levels of process gas energizers, process gas pressure, and substrate temperature. An etching endpoint is detected immediately prior to etching through the layer on the substrate by the steps of (1) directing an incident light beam through a window adjacent to the process zone to be incident on the substrate, (2) maintaining a measurable intensity of the reflected light beam through the window by holding a mask having apertures against the window to reduce deposition of process gas byproducts on the window, and (3) measuring a property of a reflected light beam that is reflected from the substrate immediately prior to etching through the layer on the substrate. The process conditions in the chamber are changed in relation to the measurement of the property of the reflected light beam.

In another aspect, the invention is directed to a process chamber having a window in a wall of the process chamber for monitoring the process being conducted on a substrate and a magnetic field source adapted to provide a magnetic flux across the window. The chamber comprises a support, a process gas distributor, and an exhaust system by which a substrate held on the support is processed by the energized process gas, forming process residues in the process chamber, and the magnetic field source provides magnetic flux across the window to reduce the deposition of process residues on the window.

In yet another aspect, the present invention comprises a process chamber for processing a semiconductor substrate, the process chamber comprising a window and means for maintaining a magnetic flux across the window. The process chamber further comprises a support, a process gas distributor, and an exhaust system. A substrate held on the support is processed by the energized process gas thereby forming process residues in the process chamber. The means for maintaining magnetic flux across the window reduces deposition of process residues on the window.

The present invention also comprises a method of processing a substrate, comprising the steps of placing the substrate in a process chamber and maintaining first process conditions in the process chamber to process the substrate, the first process conditions including providing an energized process gas to the process chamber. Maintaining a magnetic flux across a window in a wall of the process chamber. Directing an incident light beam through the window, and changing the first process conditions are changed to second process conditions in relation to the measurement of the property of the reflected light beam.

In another aspect, the invention is directed to a process chamber having a window in a wall of the process chamber for monitoring the process being conducted on a substrate, and an electrical field source adapted to couple electrical energy to the window. The chamber further comprises a support, a process gas distributor, and an exhaust system. By which a substrate held on the support is processed by the energized process gas, forming process residues in the process chamber, and the electrical energy coupled to the window reduces deposition of the process residues on the window.

In yet another aspect, the present invention comprises a process chamber for processing a semiconductor substrate, the process chamber comprising a window, and means for electrically biasing the window. The process chamber further comprises a support, a process gas distributor, and an exhaust system. By which a substrate held on the support is processed by the energized process gas, forming process residues in the process chamber, and the means for electrically biasing the window reduces deposition of process residues on the window.

In yet another aspect, the present invention comprises a method of processing a substrate, comprising the steps of placing the substrate in a process chamber and maintaining process conditions in the process chamber to process the substrate, the process conditions including providing an energized process gas in the process chamber. Providing a window in a wall of the process chamber, and maintaining an electrical flux across the surface of the window. The electrical flux having an electrical field component that is perpendicular to the plane of the window.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawings, and the invention includes any combination of these features.

FIG. 4b is a schematic top view of the window and overlying mask of FIG. 4a;

FIG. 6a is a partial schematic side view of another process chamber embodiment showing a magnetic field source for maintaining a magnetic flux across the window;

FIG. 6b is a top view of the window of FIG. 6a showing a permanent magnet having a pair of facing magnetic poles with an aperture therebetween;

FIG. 6c is a schematic top view of the window of FIG. 6b showing the magnetic flux lines across the aperture;

FIG. 6d is a schematic top view of window and a magnetic field source comprising a plurality of magnetic poles around an aperture;

FIG. 8a is a partial schematic side view of another process chamber embodiment with a window and an electrode behind the window;

FIG. 8b is a schematic top view of the electrode of FIG. 8a showing an array of eddy current reducing slots;

FIG. 8c is a schematic top view of another embodiment of the electrode and eddy current slots; and FIG. 8d is a schematic top view of another embodiment of the electrode and eddy current slots.

DESCRIPTION

Figure 1:
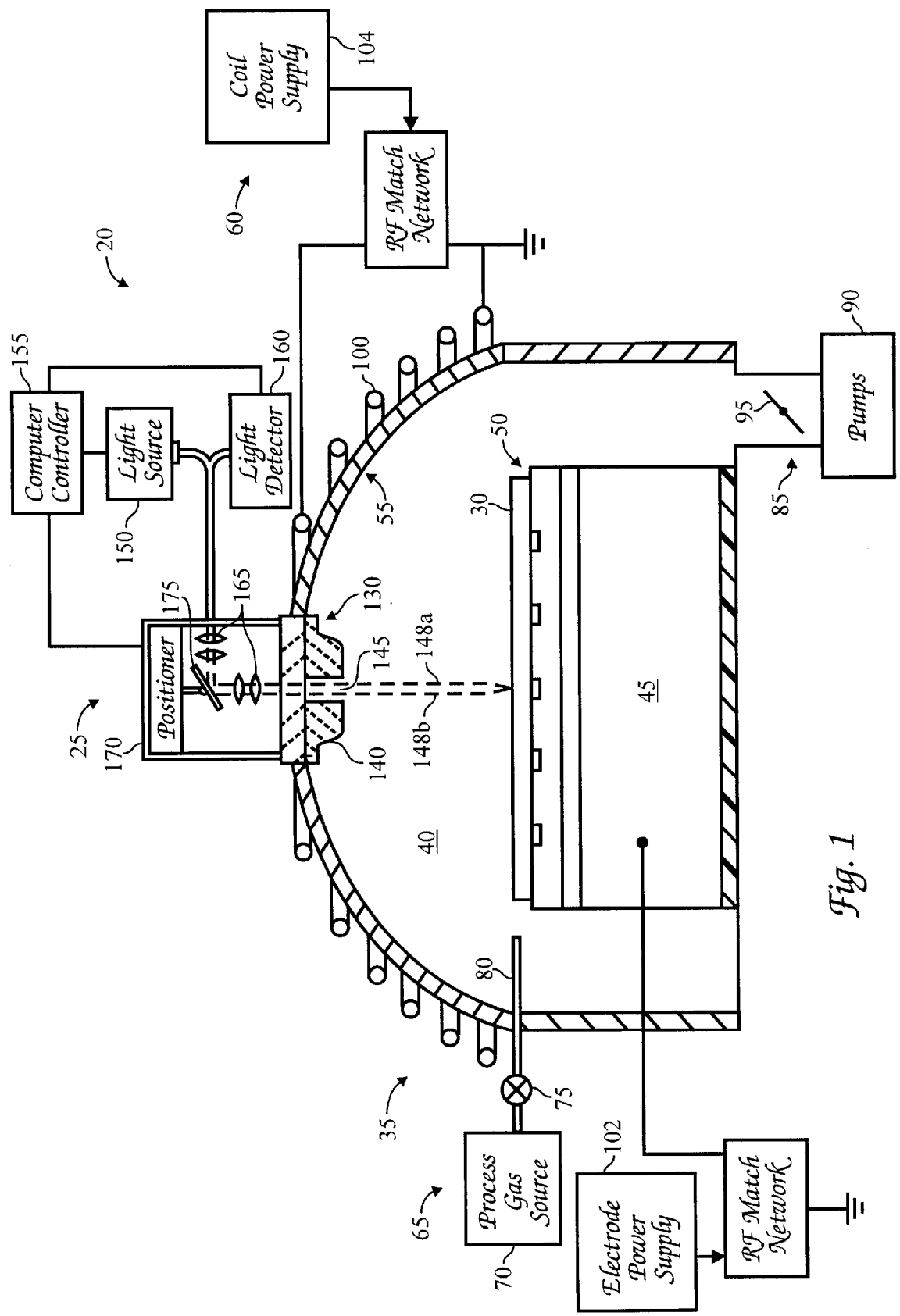
FIG. 1 is a schematic sectional view of an embodiment of a process chamber according to the present invention showing a window and overlying mask.

The semiconductor processing apparatus 20 and process monitoring system 25 of the present invention is useful for fabricating integrated circuits on a semiconductor substrate 30. The processing apparatus 20, as schematically illustrated in FIG. 1, comprises a process chamber 35 having a process zone 40 for processing the substrate 30, and a support 45 for supporting the substrate 30 in the process zone 40. An electrostatic chuck 50 holds the substrate 30 on the support 45 during processing of the substrate 30. The process zone 40 surrounds the substrate 30 and typically comprises a volume of about 10,000 to about 50,000 cm$^3$. The process chamber 35 can comprise a flat rectangular shaped ceiling 55, or a ceiling which is arcuate, conical, dome-shaped, or multi-radius dome-shaped. Preferably, the ceiling 55 is dome-shaped to enable a gas energizer 60 to uniformly couple power across the entire volume of the process zone 40 thereby providing a more uniform density of energized gaseous species across the substrate surface than a flat ceiling 55.

Process gas is introduced into the process chamber 35 through a gas distribution system 65 that includes a process gas source 70, a gas flow control valve 75, and a process gas distributor 80. The gas distributor 80 can comprise gas outlets located at or around the periphery of the substrate 30 (as shown), or a showerhead mounted on the ceiling 55 of the process chamber 35 with outlets therein (not shown). Spent process gas and etchant byproducts are exhausted from the process chamber 35 through an exhaust system 85 (typically including vacuum pumps 90 such as a 1000 liter/sec roughing pump and a 1000 to 2000 liter/sec turbo-molecular pump) capable of achieving a minimum pressure of about 10$^{-3}$ mTorr in the process chamber 35. A throttle valve 95 is provided in the exhaust system 85 to control the flow of spent process gas and the pressure of process gas in the process chamber 35.

The gas energizer 60 couples electromagnetic energy to the process gas to form energized gaseous species. In the embodiment shown in FIG. 1, the gas energizer 60 comprises an inductor antenna 100 encircling the process chamber 35 to energize the process gas directly in the process zone 40 through inductive coupling by applying an RF current to the inductor antenna 100. Alternatively, the process gas is energized by capacitive coupling by applying an RF voltage to a gas energizer 60 comprising process electrodes formed by the support 45 and the ceiling 55 of the process chamber 35. In the process chamber 35 of FIG. 1, the ceiling 55 comprises a semiconducting material to function both as a process electrode for capacitively coupling RF energy into the process chamber 35, and as a window for inductively coupling RF energy into the process chamber 35. The frequency of the RF energy applied to the inductor antenna 100, or process electrodes 45,55, is typically from about 50 KHz to about 60 MHz, and more typically about 13.56 MHz. Preferably, the RF voltage applied to the process electrodes 45,55 by an electrode power supply 102 is at a bias power level of from about 1 to about 500 Watts; and the RF current applied to the inductor antenna 100 by a coil power supply 104 is at a source power level of from about 500 to about 2000 Watts.

Figure 2:
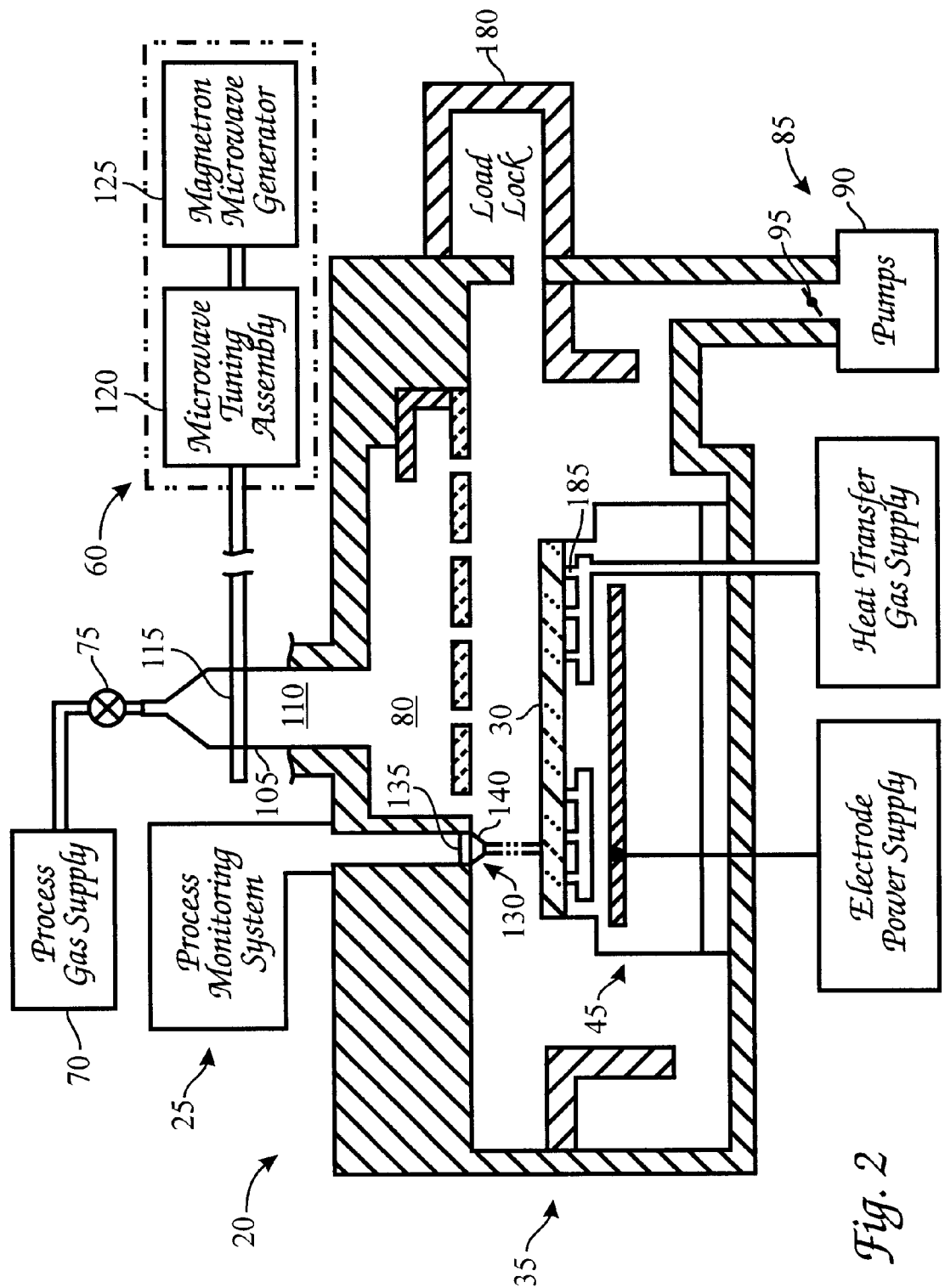
FIG. 2 is a schematic sectional view of another process chamber according to the present invention.

FIG. 2 shows an alternative embodiment of the processing apparatus 20 in which the process gas is energized or activated by the gas energizer 60 in a remote chamber 105, such as a tube or cylinder adjacent to the process chamber 35. By "remote" it is meant that the center of the remote chamber 105 is at a fixed upstream distance from the center of the process chamber 35. The remote chamber 105 comprises a gas energizer 60 that couples microwaves or other frequencies of electromagnetic energy from a suitable source into a remote zone 110, to activate process gas introduced into the remote chamber 105. A suitable microwave source comprises a microwave applicator 115, a microwave tuning assembly 120, and a magnetron microwave generator 125 and is typically operated at a power level of from about 200 to about 3000 Watts, and at a frequency of from about 800 MHz to about 3000 MHz.

Figure 3A:
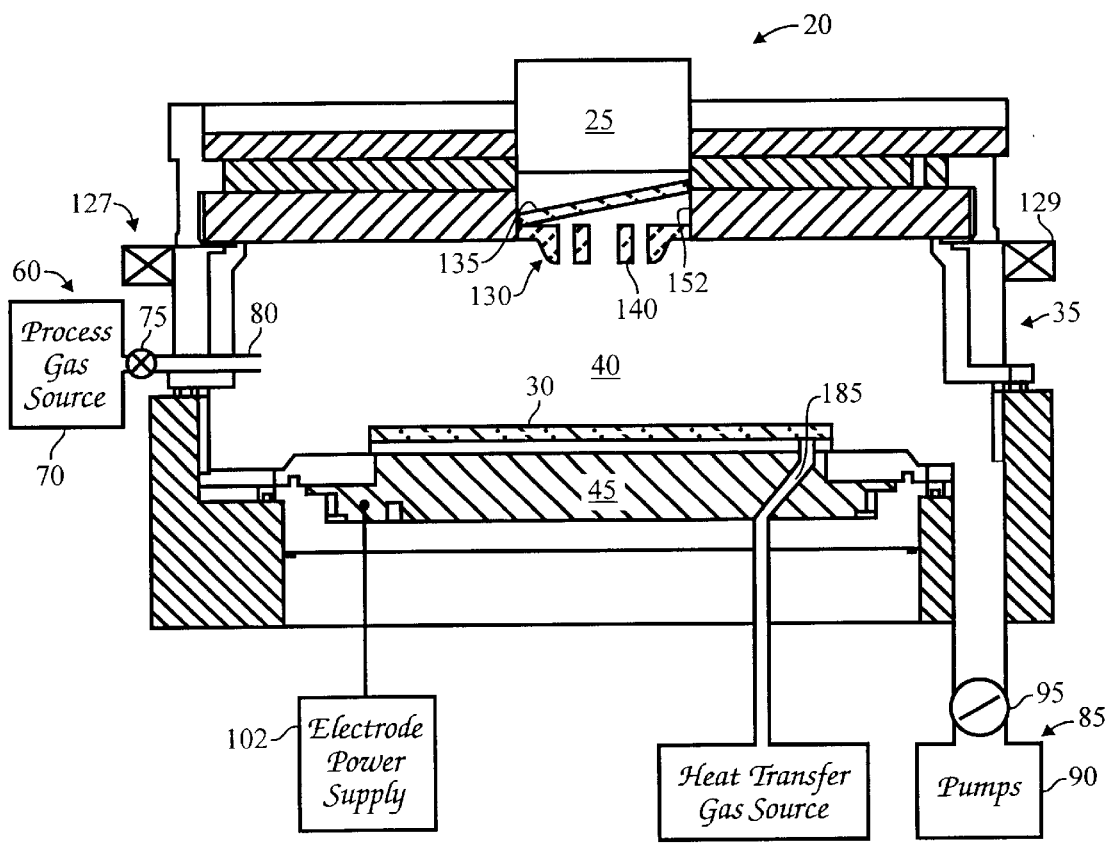
FIG. 3a is a schematic sectional view of yet another process chamber having a tilted window and overlying mask according to the present invention.

In yet another embodiment of the processing apparatus 20, the uniformity and density of ions in the energized process gas can be enhanced using electron cyclotron resonance or a magnetic field generator 127, such as permanent magnets or electromagnetic coils 129. For example, a MxP+ OXIDE ETCH chamber, commercially available from Applied Materials Inc., Santa Clara, Calif., and generally described in commonly assigned U.S. Pat. No. 4,842,683, issued Jun. 27, 1989, which is incorporated herein by reference. Referring to FIG. 3a, process gas is introduced into the process zone 40 and energized by an electric field generated by applying a RF power to the support 45 and the ceiling 55 or sidewalls of the process chamber 35. Preferably, the magnetic field comprises a rotating magnetic field with the axis of the field rotating parallel to the plane of the substrate 30. The magnetic field in the process chamber 35 should be sufficiently strong to increase the density of the ions formed in the energized process gas, and sufficiently uniform to reduce charge-up damage to features formed on the substrate 30 such as CMOS gates. Generally, the magnetic field as measured on a surface of the substrate 30 is less than about 500 Gauss, more typically from about 10 to about 100 Gauss, and most typically from about 10 Gauss to about 30 Gauss.

The process monitoring system 25 monitors the progress of a process being performed in the process chamber 35 through a window 130 in the process chamber ceiling 55 or a wall that is transparent to light that is emitted from, or directed into, the process chamber 35. The process monitoring system 25 is particularly useful for monitoring the progress of a layer being etched, and to prevent damaging an underlying layer on the substrate 30. Suitable process monitoring systems 25 include detectors based on optical emission, ellipsometry, and interferometry. Optical emission detectors detect changes in the spectral lines of light spectra emitted by species in the energized process gas to detect changes in chemistry that would indicate the beginning of etching of the underlying layer. Ellipsometers project a light beam at an acute angle to the surface of the substrate 30 and detect a phase shift between portions of the light beam reflected off the top and bottom surfaces of a transparent film on the substrate 30. An interferometer also reflects a beam of light off the top and the bottom surface of a transparent film on the substrate 30. However, an interferometer determines the thickness of the film on the substrate 30, by measuring the magnitude of constructive or destructive interference between the reflected light beams, and does not need to project the incident light beam at an acute angle relative to the surface of the substrate 30. In fact, typically the interferometer directs the light beam at nearly a right angle relative to the surface of the substrate 30, i.e., at an angle of close to 90°. Unlike an optical emission detector, the interferometer detector can be used to detect and stop a semiconductor etching process before reaching an underlying layer below the layer being etched. Also, because the light beam is directed at nearly a right angle, the interferometer can be used for etching features having high aspect ratios, which would block the low angle beam of the ellipsometer. Thus it is generally preferred to use an interferometer system to detect the endpoint of an etch process performed in the process chamber 35.

Figure 4A:
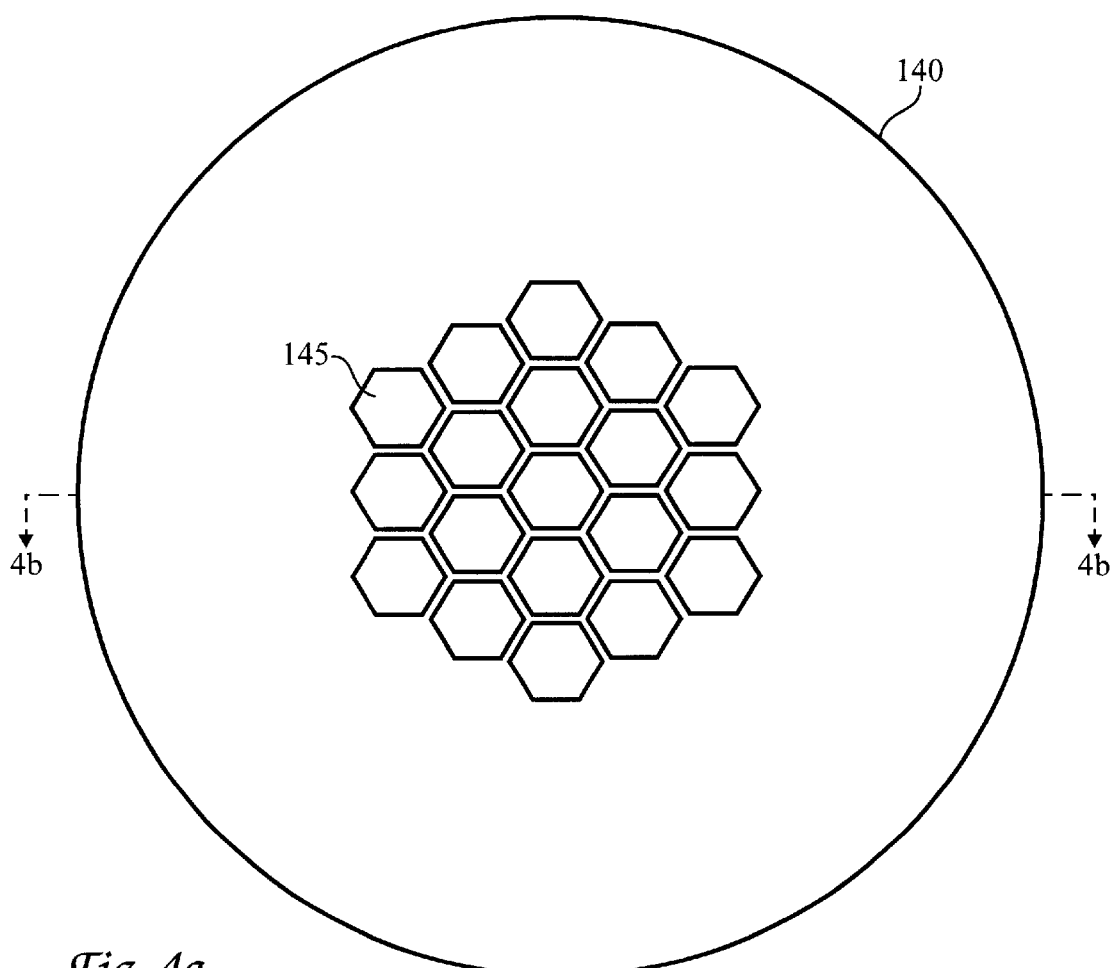
FIG. 4a is a schematic side view of another embodiment of a window and overlying mask.
Figure 4B:
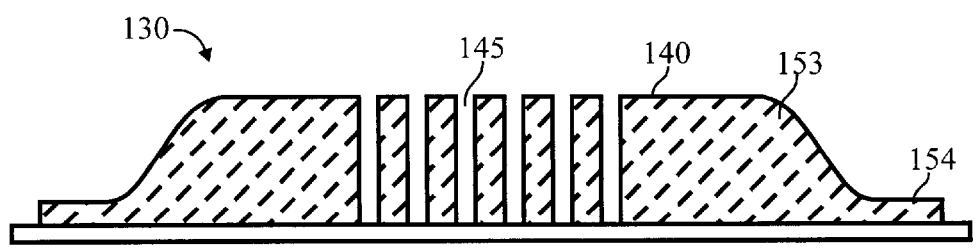

Referring to FIGS. 4a and 4b, a window 130 according to the present invention comprises a transparent plate 135 and an overlying mask 140 having at least one aperture 145 extending therethrough. The mask 140 covers the surface of the transparent plate 135 facing the inside of the process chamber 35 so that light can be transmitted through the transparent plate 135 and the aperture 145 of the mask 140 to monitor the process being conducted on the substrate 30. The mask 140 covering the transparent plate 135 serves to reduce deposition of process residue, byproducts, and other deposits on the window 130, thereby allowing accurate and reproducible monitoring of processes conducted on the substrate 30. The light transmitted through the window 130 comprises plasma spectra for plasma emission analysis or light reflected from the substrate 30 that is used for process monitoring systems 25 based on interferometry or ellipsometry principles. The window 130 is shaped, sized, and located to allow an incident light beam 148a transmitted therethrough to be incident on the substrate 30 at an angle that is sufficiently large to provide a near vertical incidence of the light near the center of the substrate 30. Generally, the window 130 can comprise any shape including circular, oval, or polygonal shape.

The transparent plate 135 of the window is made of solid transparent material that is transparent to selected frequencies of electromagnetic radiation used in the process monitoring system 25. Preferably, the transparent plate 135 is transparent to ultraviolet, visible, and infrared light from a light source 150 used to provide the incident light beam 148a for the endpoint detection system. To prevent attenuation of the incident light beam 148a by scattering, both surfaces of the transparent plate 135 are polished smooth with a peak-to-peak RMS roughness (i.e., the vertical distance between the peaks and valleys of the roughness on the polished crystal face) that is sufficiently small to allow light to be transmitted therethrough. Preferably, the peak-to-peak RMS roughness of the transparent plate 135 is less than about 1 μm, and more preferably less than about 0.1 μm. The surface of the transparent plate 135 can be polished smooth by any suitable means, for example, by flame polishing or conventional lapping and/or ablating methods.

The transparent plate 135 is made of a ceramic monocrystalline material that is a single crystal material or one that comprises a few (typically 10 or fewer) large crystals that are oriented in the same crystallographic direction, and is transparent to particular wavelengths of light or visible radiation. Preferably, the monocrystalline material comprises a ceramic, such as for example, one or more of $Al_2O_3$, Si, $SiO_2$, $TiO_2$, $ZrO_2$, or mixtures and compounds thereof. The monocrystalline ceramic material is selected to exhibit high corrosion resistance in a particular plasma or other process environment. In a preferred embodiment, the transparent plate 135 comprises polished sapphire, which is a monocrystalline form of alumina that exhibits high chemical and erosion resistance in halogen plasma environments, especially fluorine containing environments. Monocrystalline sapphire also has a high melting temperature that allows use of the window 130 at temperatures exceeding 1000° C., and preferably in excess of 2000° C.

In one embodiment, the transparent plate 135 is tilted at a small angle relative to the plane of a surface substrate 30, so that light reflected from the transparent plate 135 is not reflected back into the process monitoring system 25, thereby allowing greater signal gain in process monitoring, A suitable angle of tilt is at least about 2 degrees, and more preferably, from about 2 to about 15 degrees. For example, FIG. 3a shows a tilted transparent plate 135 that is angled about 3 degrees relative to the plane of the substrate 30. The tilted plate 135 is angled by raising one side or edge of the transparent plate 135 higher than the opposing side/edge of the transparent plate by providing a raised step 152 below an edge of the transparent plate 135. The step is sized depending on the angle of elevation or tilt that is desired and is typically from about 0.5 to about 5 mm depending on the diameter of the transparent plate 135.

The mask 140 covering the transparent plate 135 serves to reduce deposition of process gas byproducts formed in the process chamber 35 on the transparent plate 135. The mask 140 is made of a material that is resistant to erosion by the process gas and/or the plasma formed from the process gas. Preferably, the mask 140 is made from a plasma resistant material comprising one or more of $Al_2O_3$, $SiO_2$, AlN, BN, Si, SiC, $Si_3N_4$, $TiO_2$, or $ZrO_2$. Referring to FIG. 4b, one embodiment of the mask comprises a thick disc of aluminum oxide that is shaped to cover substantially the entire exposed portion of the transparent plate 135 of the window. Preferably, when the transparent plate 135 comprises a disc, the mask 140 comprises a right cylinder that is shaped and sized to cover the surface of the disc. More preferably, the mask 140 comprises disc having a raised central portion 153 with a surrounding annular lip 154. The thickness of the raised central disc portion is preferably from about 0.5 mm to about 500 mm. The diameter of the raised central portion 153 of the mask is from about 50 mm to about 200 mm. The thickness of the annular lip 154 is from about 0.5 mm to about 10 mm, and a smooth rounded edge forms the transition between the raised central disc and the annular lip 154.

The mask 140 comprises at least one aperture 145 that allows a sufficient intensity of light to pass through the aperture to operate the process monitoring system 25, and that controls the access of energized process gas species to the transparent plate 135 of the window 130. The cross-sectional area of the aperture 145 sufficiently large to allow a sufficiently large amount of light flux to ingress and egress from the process chamber 35. The aperture 145 can be cylindrical, or polygonal in shape, including triangular, hexagonal, square, and rectangular, of which hexagonal is preferred since it enables a plurality of apertures 145 to be more closely spaced allowing improved transmission of light into and out of the process chamber 35. The aspect ratio of the aperture 145 controls the access of energized process gas species to the transparent plate 135 of the window 130. Preferably, the aspect ratio of the aperture 145 is from about 0.25:1 to about 12:1.

In one embodiment, the aperture 145 is shaped and sized to limit or reduce access of the process gas to the transparent plate 135 and thereby prevent deposition of process gas byproducts and other deposits on the transparent plate 135. This is accomplished by making the aspect ratio of the aperture 145 (which is the ratio of the aperture's height to its diameter/width) sufficiently large or high to limit access of the neutral flux of process gas, and therefore access of the volatilized process gas byproducts that condense to form process residues, into the aperture 145 and onto the underlying transparent plate 135 of the window 130. Preferably, the aspect ratio is from about 1:1 to about 12:1, and more preferably from about 3:1 to about 7.5:1.

Figure 3B:
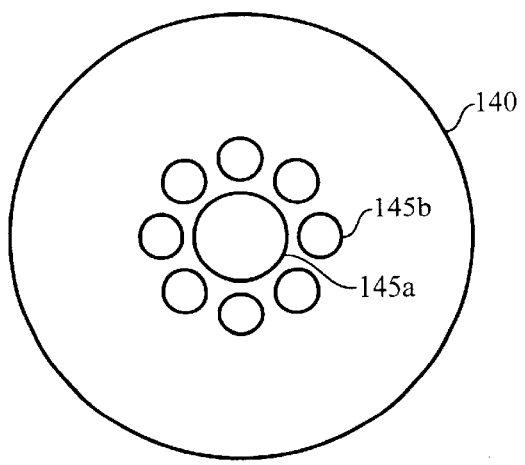
FIG. 3b is a schematic top view of one embodiment of a mask according to the present invention.

In another embodiment, as illustrated in FIG. 3b, the shape and size of the aperture 145 in the mask 140 is selected to reduce the accumulation of process residue on the underlying transparent plate 135 of the window 130 by a different mechanism. In this version, the aspect ratio of the aperture 145 is sufficiently small to allow ions of the energetic process gas to enter the aperture and etch away the process residues formed on a sidewall of the aperture 145 and/or on the surface of the transparent plate 135. The aperture 145 in this embodiment generally has a larger sized diameter or width relative to its height to provide a relatively low aspect ratio. The low aspect ratio preferentially filters out energetic plasma species to allow a higher percentage of highly directional and energetic plasma species to enter into the aperture 145 and sputter-etch away the process residue deposited on the sidewalls of the aperture 145 and on the surface of the transparent plate 135. A suitable aspect ratio is from about 0.25:1 to about 3:1, and more preferably from about 0.5:1 to about 2:1.

The mask 140 can also comprise a plurality of apertures 145, and more preferably, an array of apertures as already described. Preferably, the total area of the aperture 145 is sufficiently large to transmit both an incident light beam 148a and a reflected light beam 148b or the desired level or intensity of plasma spectra flux for plasma emission analysis. Preferably, for process monitoring systems 25 comprising interferometry or ellipsometry systems, the total area of the transparent plate 135 exposed by the aperture 145 is sized to enable the incident light beams 148a to be moved or scanned across the surface of the substrate 30 to find a particular feature, such as a via or a deep narrow trench, or a suitably flat and/or transparent point at which to make a process endpoint measurement. For example, in a process chamber 35 used for processing 300 mm substrates, the area of the aperture 145 should be preferably from about 200 to about 2000 mm$^2$ (0.3 to about 3 in$^2$) and more preferably from about 400 about 600 mm$^2$ (0.6 to about 0.9 in$^2$).

In another embodiment, shown in FIGS. 4a and 4b, the mask 140 can also comprise a plurality of apertures 145 that are spaced apart from one another. For example, the mask can comprise an array of apertures 145 sized and arranged to have a total opening area that provides a sufficient intensity of light to pass through to operate the process monitoring system 25. The actual size, number or arrangement of apertures 145 depends upon the particular process chamber 35, the substrate diameter, the process, and the type of process monitoring system 25. In one embodiment which is particularly useful for interferometric optical systems, the mask 140 comprises apertures 145 having an opening dimension, such as a diameter or a width of about 0.1 to about 50 mm, and a height of about 0.5 to about 500 nm. The array preferably consists of from about 3 to about 800 apertures 145, and more preferably from about 7 to about 200 apertures 145, as shown in FIG. 4b. The apertures 145 are spaced apart from one another by a distance of about 0.25 to about 15 mm. Also, as shown in FIG. 3b, the array can comprise different sized apertures 145, for example, first apertures 145a in the central portion that have an average diameter of about 3.5 to 5 mm, and second apertures 145b at its circumferential edge having a diameter of 2 to 3 mm.

It has been discovered that the mask 140 overlying the window 130 substantially reduces deposition of process residue on the transparent plate 135 of the window 130. For example, the overlying mask 140 and window 130 has been found to reduce deposition of etchant residue in polysilicon etching processes down to about 3 to about 10 Å/hr, which is about 100 times lower than that occurring on conventional unprotected windows. In addition, the mask 140 protects the window 130 from erosion by highly chemically reactive process gases, and has been found to extend the lifetime of the window 130. Also, the "footprint" (occupied area of clean room) of a process chamber 35 comprising a window 130 having a mask 140 according to the present invention is much smaller than that of other process chambers 35 having conventional clean-window systems.

The process chamber 35 and window 130 of the present invention allows use of process monitoring methods such as interferometry, ellipsometry, or plasma emission analysis. The reduced residue deposition on the process monitoring window 130 increases the signal to noise ratio of the process monitoring systems 25 to levels that provide accurate and reliable readings even after processing a large number of substrates 30. The accuracy of these measurement techniques provides the necessary process control for the deposition and etching of thinner films on the substrate 30, to provide faster and higher operating frequency integrated circuits. In addition, because the process chamber 35 does not have to be frequently opened to clean the surface of the window 130, the process chamber efficiency and the substrate throughput is also enhanced.

Operation of a process chamber and process monitoring system 25 using a window 130 according to the present invention will now be described. As described above, the process monitoring system 25 can be an interferometry or ellipsometry system that compares a property of the reflected light beam 148b, such as its intensity and/or phase angle, to known or stored characteristic values to calculate the endpoint of the etching process. Preferably, the process monitoring system 25 comprises a computer controller 155 that adjusts the process conditions in the process chamber 35. Upon detection of the process endpoint, the computer controller 155 changes the first process conditions to second process conditions to change the rate of etching of the layer on the substrate 30 before the entire layer is etched through or to stop the etching process. For example, the etch rate can be reduced by changing the composition of the process gas to remove aggressive etchant gases, the RF power coupled to the process gas can be lowered, or the substrate temperature can be lowered.

A suitable computer controller 155 comprises a computer program code product that operates the process chamber 35, and comprises one or more central processor units (CPUs) interconnected to a memory system with peripheral control components, such as for example, a PENTIUM microprocessor, commercially available from Intel Corporation, Santa Clara, Calif. The CPUs of the computer controller 155 can also comprise ASIC (application specific integrated circuits) that operate a particular component of the process chamber 35. The interface between an operator and the computer controller 155 can comprise a CRT monitor and a light pen (not shown), or other devices, such as a keyboard, mouse or pointing communication device.

The light source 150 comprises a monochromatic or polychromatic light source 150 that generates an incident light beam 148a having an intensity sufficiently high to provide a reflected light beam 148b that is reflected from a layer on the substrate 30, when the layer has a suitable thickness, with a measurable intensity. In one version, the light source 150 provides polychromatic light, such as a Hg—Cd lamp, which generates an emission spectrum of light in wavelengths from about 200 to about 600 nanometers. The polychromatic light source 150 can be filtered to provide an incident light beam having selected frequencies, or particular emission spectra wavelengths can be used, or color filters (not show) can be placed in front of a light detector 160 for detecting the reflected light beam 148b to filter out all undesirable wavelengths except the desired wavelength of light, prior to measuring the intensity of the reflected light beam 148b entering the light detector 160. The light source 150 can also comprise a monochromatic light source 150 that provides a selected wavelength of light, for example, a He—Ne or ND-YAG laser.

One or more convex focusing lenses 165 are used to focus the incident light beam 148a from the light source 150 as a beam spot or collimated beam on the substrate surface and to focus the reflected light beam 148a back on an active surface of the light detector 160. The size or area of the beam spot should be sufficiently large to compensate for variations in surface topography of the substrate 30 to enable etching of high aspect ratio features having small openings, such as vias or deep narrow trenches. The area of the reflected light beam 148a should be sufficiently large to activate a large portion of the active light detecting surface of the light detector 160.

Optionally, a light beam positioner 170 is used to move the incident light beam 148a across the substrate surface to locate a suitable portion of the layer being etched on which to "park" the beam spot to monitor etching process. The light beam positioner 170 comprises one or more primary mirrors 175 that rotate at small angles to deflect the incident light beam 148a from the light source 150 onto different positions of the substrate surface, and to intercept the reflected light beam 148b and focus it on the light detector 160. In another embodiment, the light beam positioner 170 is used to scan the light beam in a raster pattern across the substrate surface during processing. In this version, the light beam positioner 170 comprises a scanning assembly consisting of a movable stage (not shown) upon which the light source 150, focusing assembly, collecting lens, and detector are mounted. The movable stage can be moved through set intervals by a drive mechanism, such as a stepper motor, move the beam spot across the substrate surface.

The light detector 160 comprises an electronic component having a light sensitive surface, such as a photovoltaic cell, photodiode, or phototransistor, which provides a signal in response to the intensity of the reflected light beam 148b that is incident on the light sensitive surface. The signal can be in the form of a change in the level of a current passing through an electrical component or a change in a voltage applied across an electrical component. Preferably, the reflected light beam 148b undergoes constructive and/or destructive interference which increases or decreases the intensity of the reflected light beam 148b as the thickness of the film or trench on the substrate 30 increases or decreases, and the light detector 160 provides an electrical output signal in relation to the measured intensity of the reflected light beam 148b. The computer system receives the signal from the light detector 160, compares the signal to a stored value or waveform, and changes process conditions in the process chamber 35 according to programmed guidelines in relation to the signal.

An example of a substrate processing method according to the present invention will now be described, with reference to an exemplary etching process, in which a polysilicon overlayer on a gate oxide (silicon dioxide) underlayer, is etched without etching or damaging the underlayer. Initially, a reflectance thickness measuring machine is used to accurately determine the initial thickness of the layer to be etched on the substrate 30, such as a model UV1050 available from KLA-TENCOR, Santa Clara, Calif. The actual layer thickness is useful to estimate the overall operation time of the etching process and/or to calculate the thickness of the layer that should be etched to provide a predetermined thickness of the layer that remains on the substrate 30 after the etching process.

The substrate 30 is transferred by a robot arm (not shown) from a load-lock transfer chamber 180 through a slit valve and into the process zone 40 of the process chamber 35. The substrate 30 is placed on the support 45 where it is held by the electrostatic chuck 50. Optionally, a heat transfer gas is supplied through holes 185 in the surface of the electrostatic chuck 50 to control the temperature of the substrate 30. Thereafter, the process conditions in the process chamber 35 are set to process the particular layer on the substrate 30 and to form process gas byproducts, the process conditions comprising one or more of process gas composition and flow rates, power levels of gas energizers 60, gas pressure, and substrate temperature. The process can also be performed in multiple stages, for example, each stage having different process conditions. For example, in an etching process, one or more compositions of an energized process gas comprising etchant gas for etching the substrate 30 are provided in the process chamber 35. Suitable etchant gases for etching layers on the substrate 30, include for example, HCl, $BCl_3$, $HBr$, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The process chamber 35 is typically maintained at a pressure ranging from about 0.1 to about 400 mTorr. The etchant gas composition is selected to provide high etch rates and/or high etching selectivity ratios for etching the overlayer relative to the underlayer. When multiple layers are being sequential etched, first, second, third, etchant gas compositions can be sequentially introduced into the process chamber 35 to etch each particular layer.

The process gas is energized and maintained at first process conditions suitable for etching the substrate 30. Referring to FIG. 1, an energized process gas is provided in the process zone 40 by inductively and/or capacitively coupling energy into the process zone 40 using the gas energizer 60, or by applying microwaves to an etchant gas in the remote zone 110 of the remote chamber 105, as shown in FIG. 2. By energized process gas, it is meant that the process gas is activated or energized so that one or more of dissociated species, non-dissociated species, ionic species, and/or neutral species are excited to higher energy states in which they are more chemically reactive. Preferably, the process gas is energized by applying an RF source current to the inductor antenna 100 encircling the process chamber 35 or by applying an RF bias voltage to the process electrodes. The etchant gas ionizes in the applied electric field to form ions and neutrals that etch the layer on the substrate 30 to form volatile gaseous species that are exhausted from the process chamber 35.

The process monitoring system 25 is used to precisely change process conditions, after a given thickness of the layer on the substrate 30 is processed. In etching processes, the process monitoring system 25 can be used to change the process gas composition to provide particular etching rates or etching selectivity ratios. For example, the process monitoring system 25 can be used to stop the etching process after a first highly aggressive etching step, which provides high etch rates due to the presence of the fluorinated gas in the etchant gas, to determine the starting point for a second and less reactive etching step, which uses a process gas that is absent the fluorinated gas to etch the remaining dielectric layer at a slower etch rate to obtain more controlled etching. The process monitoring system 25 is used to detect the time at which almost all of the silicon layer is etched so that the first process conditions can be changed to less aggressive or second process conditions, or vice versa, to obtain the desired change in etching rate, etching selectivity ratio, or a change in any other property of the etching process, for example, higher/lower etching rates, or etching of underlying layers having a different composition.

Generally, in the method of the present invention, the incident light beam 148a is transmitted through the energized process gas in the process zone 40 of the process chamber 35, to be incident on the layers covering the substrate 30 while the layers are being etched. These experiments were conducted using a light source 150 consisting of a Hg—Cd lamp. A light beam from this light source 150 is directed through the window 130 to be incident on the substrate 30 at a near vertical angle, to provide a beam spot having a size sufficiently large to cover one or more of the features being etched on the substrate 30. It is preferred for the incident light beam 148a to consist of substantially only non-polarized light, because polarized light is preferentially absorbed by deposition of a thin residue on the process window 130.

When the thickness of the layer is sufficiently low (after etching for a period of time) a property of the reflected light beam 148b that reflects off both the top and bottom surfaces of the layer on the substrate 30 is measured. Changes in the measured property, such as the intensity or phase of the reflected light beam, is recorded over time to form a measured waveform pattern. The measured waveform pattern is compared to a stored waveform pattern, and when the two signals are substantially the same, the endpoint of the etching process is reached. At that time, the first process conditions are changed to second process conditions in relation to the measurement of the property of the reflected light beam. For example, first process conditions are changed to second process conditions to stop the etching process, to change the rate of etching of the layer on the substrate 30, or to change its etching selectivity ratio relative to the underlayer, before the entire layer is etched through.

The measured intensity of the reflected light beam 148b can also be plotted over time to obtain a measured waveform pattern, and the measured waveform pattern is compared to a predetermined characteristic waveform pattern to determine an endpoint of the etching process that occurs when the two waveforms are the same or substantially identical to one another, as described in commonly assigned U.S. patent application Ser. No. 09/062,520, by Grimbergen et al, filed on Apr. 17, 1998, which is incorporated herein by reference. In this method, a computer controller 155 plots the electrical output signal of the intensity of the reflected light beam 148b over time to provide a waveform spectra having numerous waveform patterns corresponding to the varying intensity of the reflected light beam 148b. The computer controller 155 calculates a real-time waveform spectra of light reflected from a thickness of a layer being processed on the substrate 30 and compares the waveform of the measured intensity to a stored characteristic waveform pattern and adjusts process conditions in the process chamber 35 when the two waveforms have substantially the same shape and form. The computer program determines the completion of a stage of processing of the layer when the measured waveform pattern comprises a repeatable waveform oscillation that occurs immediately before a terminal peak or dip in a reflected waveform pattern, the terminal peak or dip corresponding to completion of processing of the layer. The computer program can also include program code to calculate in real time, the thickness of the layer being etched that remains on the substrate 30 and accordingly adjust the process conditions in the process chamber 35. The computer program can also count the number of maxima and minima peaks in the intensity of the reflected light beam and, after a predetermined number of peaks are reached, alter process conditions in the process chamber 35, according to programmed guidelines.

In another aspect of the present invention, an in-situ or dry cleaning process can be performed in conjunction with the process monitoring method of the present invention to enhance the operation of the process chamber 35. In this method, a first layer on a substrate 30 is etched in a first stage of the etching process by a process gas comprising a composition of etchant gas that provides a high etching rate and a process chamber cleaning gas that removes the residue deposits and process gas byproducts as they are formed on the walls of the process chamber 35. Because the cleaning gas is an extremely aggressive fluorine containing gas which will quickly etch through a thin underlying gate oxide layer, the process monitoring system 25 is used to detect the process endpoint and change the composition of the process gas to remove the cleaning gas immediately prior to etching through the first layer. The cleaning gas in the first stage of the process cleans the process chamber 35 without requiring stopping etching in between processing of batches of substrates 30 to perform wet cleaning processes. In a preferred embodiment, the etchant gas comprises one or more of $Cl_2$, $N_2$, $O_2$, HBr, or He—$O_2$; and the cleaning gas comprises inorganic non-hydrocarbon containing fluorinated gas such as one or more of $NF_3$, $CF_4$, or $SF_6$. Preferably, the volumetric flow ratio of cleaning gas to etchant gas is selected to remove substantially all residue deposits and process gas byproducts from process chamber surfaces upon completion of the first stage. More preferably, the volumetric flow ratio of cleaning gas to etchant gas is selected to remove substantially all residue deposits and process gas byproducts formed during processing of at least 2000 substrates 30 in the process chamber 35, without performing a separate cleaning step for cleaning the process chamber 35. A suitable volumetric flow ratio of cleaning gas to etchant gas is from about 1:20 to about 1:1, and more preferably from about 1:10 to about 2:3, and most preferably about 2:3. It has been discovered that at these volumetric flow ratios substantially all the etchant residue on the process chamber surfaces is removed without eroding the process chamber surfaces. In addition, it has been unexpectedly discovered that the process chamber surfaces are cleaned and conditioned by the etchant and cleaning gas combination step, without requiring a separate process chamber conditioning or seasoning step. Suitable cleaning gas compositions are provided in aforementioned U.S. patent application Ser. No. 09/062,520.

EXAMPLES

The following examples illustrate use of a process chamber 35 having a window 130 and mask 140 according to the present invention. In these examples, a series of 200 mm silicon substrates 30 having a 2500 Å polysilicon layer, a 45 Å silicon dioxide layer, and a 2000 Å patterned resist layer, were etched. A multi-stage process was used for etching the polysilicon layer on a substrate 30. In a first or main etching stage, an energized process gas comprising 50 sccm $CF_4$ and 40 sccm $SF_6$ is provided in the process chamber 35 to etch through most of the thickness of the polysilicon layer exposed through openings in the resist layer. The process gas is energized by applying a source power of 750 watts to the inductor antenna 100, and a bias power of 90 watts to the process electrodes 45, 55. The process chamber pressure is maintained from about 2 to about 3 mTorr. After the process endpoint is detected using a process monitoring system 25, the main etch stage was stopped and remaining polysilicon removed in a second or over-etch stage substantially without damaging the underlying silicon dioxide layer. In the overetch stage, a second energized process gas comprising 60 sccm of $SF_6$ is introduced in the process chamber 35, and energized by a source power of 600 watts and a bias power of 1 watt. The process chamber 35 is maintained at a pressure of about 10 mTorr.

The process was performed in a process chamber 35 having a window 130 comprising masks 140 of varied thicknesses and having apertures 145 of varying number, diameter, and aspect ratios to determine their effectiveness in reducing accumulation of process residue on the transparent plate 135. In general, the mask 140 comprised an aluminum oxide disc having a raised central portion 153 surrounded by a thin annular lip 154 as shown in FIG. 4b. The mask 140 was positioned about 0.038" from the transparent plate 135, and small slides (not shown) of an etch resistant material such as sapphire or Kapton® were positioned between the mask 140 and transparent plate 135 to shield a portion of the transparent plate 135 exposed through each aperture 145. The total time the process chamber 35 was in operation was recorded and after a specified times the window 130 was removed and the thickness of process residue deposited on and/or the amount of material removed from the transparent plate 135 was measured using a stylus step height measuring device such as a DekTak, or an Alpha-step. The transmission of light through the transparent plate 135 was also measured using a light source of known intensity and a light detector capable of accurately measuring the intensity of the transmitted light.

Example 1

In a first example, the mask 140 had a raised central portion 153 19 mm (0.75") thick, and comprised a hexagonal pattern of 19 apertures, each 3.8 mm (0.15") wide and each having an aspect ratio of 5:1. This example demonstrates that an array of apertures 145 having a small diameter and a large aspect ratio reduce deposition of process residue on the transparent plate 135 of the window 130. After etching in the chamber for 80 minutes, the window 130 was disassembled, the sapphire slide removed, and the transparent plate 135 scanned using a stylus step height measurement instrument to determine the accumulation of process residue and the etching of the transparent plate 135. Because the high aspect ratio of the small apertures 145 excluded all the residue forming plasma species from reaching the transparent plate 135, there was no discernable etching of the transparent plate 135. Moreover, the thickness of process residue on the transparent plate 135 was below the limit that could be measured, i.e., less than 600 Å. The change in transmission of light through the transparent plate 135 was also found to be below detectable limits, i.e., less than 1%.

Example 2

In this example, the mask 140 comprised a raised central portion 153 0.75" thick and circular apertures 145 having varying diameters from 0.1" to 1". After the process chamber 35 was operated for 80 minutes, the mask 140 was found to significantly reduce deposition on the transparent plate 135 as compared to conventional windows. The window 130 was replaced, uncleaned, and examined again after an additional 18 and 25 hours of operation. The accumulation of residue deposits, and etching of the transparent plate 135 for the various sized apertures 145 after 25 hours of operation is summarized in Table I.

deposition of the process residues on the transparent plate 135 of the window. The magnetic field source 195 comprises at least one permanent magnet 200 or electromagnet (not shown) that is positioned adjacent to the window 130 to couple magnetic energy or flux across at least a portion of the surface of the window 130. Preferably, the magnetic field lines are generally confined to the space around the window 130, and penetrate only a shallow depth or not at all into the process chamber 35.

A preferred magnetic field source 195 comprises a permanent magnet 200 arranged about the window to provide a magnetic field component that extends across a portion of the transparent plate 135 and in the plane of the window 130. Preferably, the magnetic field source 195 provides a localized magnetic flux across the window 130 that has a higher density across the window than their density at other portions of the process chamber 35, and that terminates at the edges of the window 130.

The magnetic flux across the window 130 comprises magnetic field components that prevent charged process gas species from reaching the transparent plate 135. For example, when the magnetic field lines or magnetic flux has a directional vector that is parallel to the plane of the window 130, the field lines serve to confine charged plasma ions and electrons of the energized process gas to a circular

TABLE I

| HOLE SIZE (inches) | ASPECT RATIO | CENTER THICKNESS (angstroms) | EDGE ETCH (angstroms) | PROJECTED TRANSMISSION OF 245 NM AT 150 HOURS |
|---|---|---|---|---|
| 1" | 0.75 | 4000 to 5000 | −3000 to −6000 Å at 5 mm | High at edge; moderate in center |
| 0.5" | 1.5 | 0 | −2500 Å | High |
| 0.25" | 3 | 550 to 650 | −250 Å at 0.5 mm | Moderate |
| 0.2" | 3.75 | 410 to 500 | None | Moderate to High |
| 0.15" | 5 | 170 to 200 | None | High |
| 0.1" | 7.5 | 70 to 100 | None | High |

Figure 5:
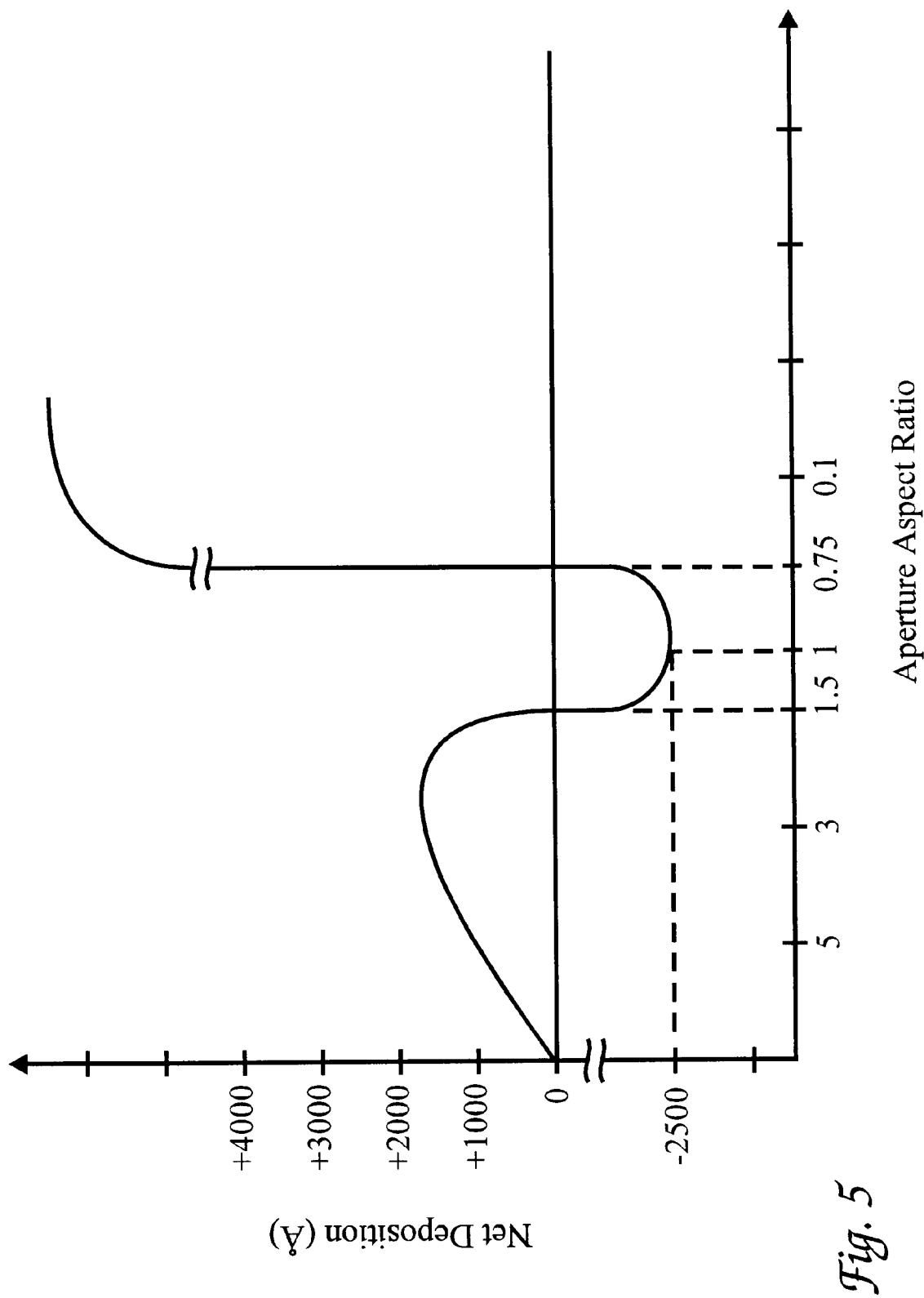
FIG. 5 is a graph showing the net deposition of process residue as a function of the aspect ratio of different sized apertures in a test mask.

Referring to the graph of FIG. 5 it is seen that as the diameter of the aperture 145 becomes smaller and the aspect ratio increases, the flow of neutral plasma species flux that contribute to deposition of the process residue deposits into the aperture 145 is gradually reduced and can be entirely excluded from reaching the transparent plate 135. The net deposition of process residue on the transparent plate 135 initially increases as the diameter of the apertures 145 are reduced from 0.5" to 0.25", and thereafter decreases as the aperture 145 continues to become smaller. In contrast, as aperture size increases above 0.5" and the aspect ratio is reduced from 2:1 to 0.75:1, deposition controls at the center of the aperture 145, while etching dominates near the sidewall or edge of the aperture 145. In contrast, for apertures 145 having aspect ratios of from about 1 to about 2, there is negative net deposition rate across substantially the entire width of the aperture, arising from allowing entry of substantially only energetic plasma species into the aperture 145.

Magnetic Field Confinement

In another embodiment of the present invention, as illustrate is FIG. 6a, the process chamber 35 comprises a magnetic field source 195 that is adapted to provide or serve as means for maintaining a magnetic flux near or across the window 130. When a substrate 30 held on the support 45 is processed by the energized process gas, the magnetic flux extending across a portion of the window 130 reduces the path that is at a some fixed average distance away from the transparent plate 135 and thereby prevents deposition of process residues on the plate 135. For example, a magnetic flux that extends across a portion of the window 130 and along a plane parallel to the window causes charged ions and electrons entering the region of the magnetic flux to rotate in a circular motion in this region. The magnetic field strength should be sufficiently high to confine the charged ions and electrons to the region of the magnetic field substantially without allowing the charged species to exit from this region. Generally, a suitable magnetic field strength is from about 10 to about 10,000 Gauss, and more preferably from about 50 to about 2000 Gauss.

In one embodiment, shown in FIGS. 6b through 6d, the magnetic field source 195 comprises a plurality of magnetic poles 205 disposed about a perimeter of the window 130. The magnetic poles 205 around the perimeter of the window 130 comprise opposing magnetic polarities that are in facing relationship to one another. For example, as shown in FIG. 6b, the magnetic field source 195 can comprise at least a pair of north and south poles 205a,b that face one another. Preferably, the magnetic field source 195 comprises a magnetic yoke 210 (by which it is meant a ferromagnetic yoke of a permanent magnet or an electromagnet) having an aperture 215 therein. The magnetic yoke 210 provides a symmetrical magnetic field across the aperture 215. FIG. 6b shows an exemplary magnetic yoke 210 comprising at least a pair of radially extending poles 205a,b that face one another and have opposing magnetic polarity. Alternatively, as shown in FIG. 6d the magnetic yoke 210 can comprise a plurality of yokes of magnetic material that are arranged to provide a plurality of radially opposing magnetic poles 205 facing one another across the aperture 215 to provide a magnetic flux across the surface of the window 130.

The aperture 215 in the annular shaped or circumferentially disposed magnetic yoke 210 is sized to allow light to pass through the window 130. The facing magnetic poles 205a,b apply a magnetic field generally straight across the aperture 215 in the magnetic yoke 210. The aperture 215 is sized sufficiently large to allow a sufficient intensity of light to pass through to operate the process monitoring system 25. The total cross-sectional area of the aperture 215 is sufficiently large to allow a sufficiently large amount of light to ingress and egress from the process chamber 35 through the aperture 215. The aperture can be cylindrical, triangulated, or rectangular in shape, of which a cylinder provides good axial symmetry for the magnetic field source and smooth internal surfaces.

Electrical Field Energizing

Figure 7:
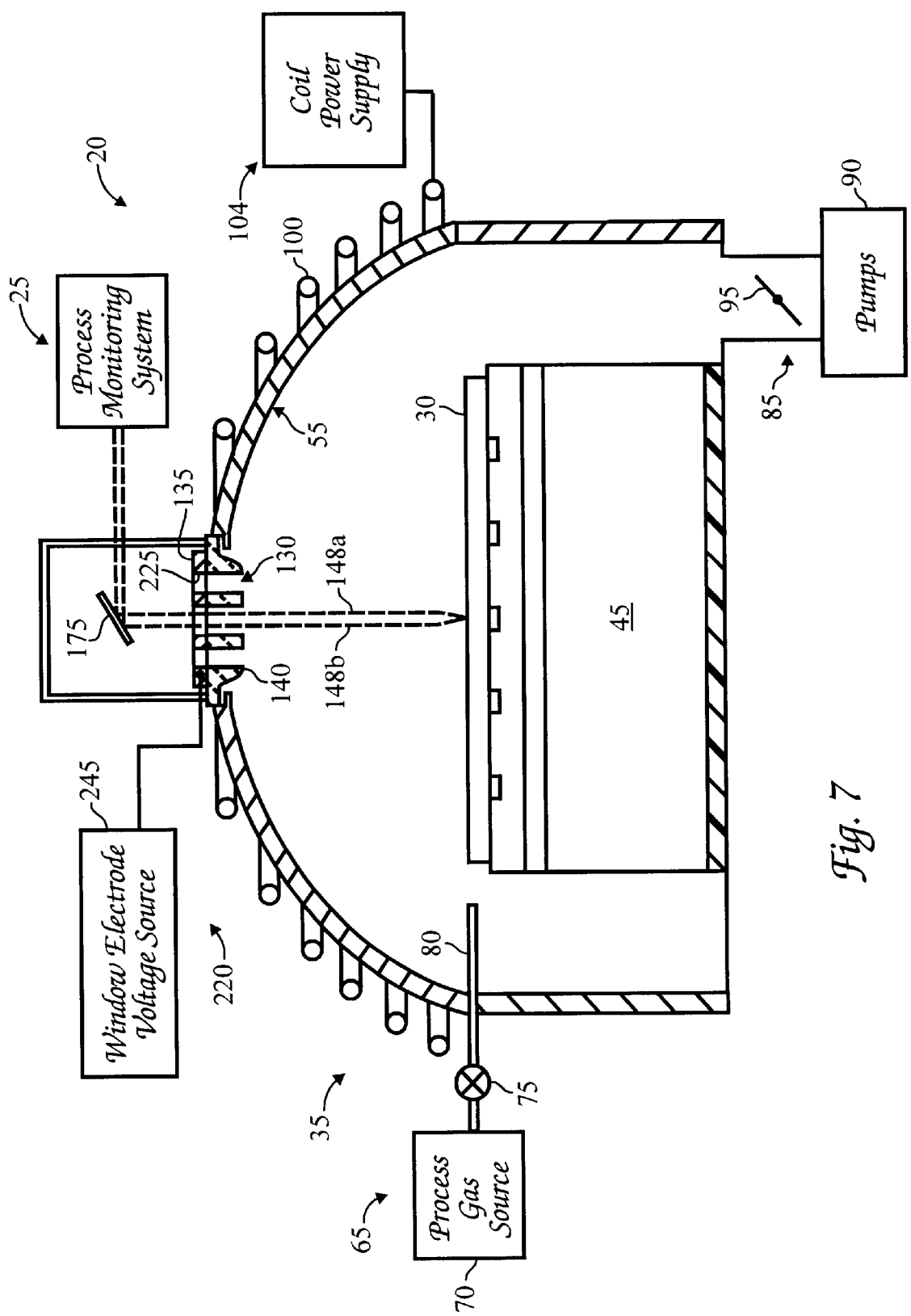
FIG. 7 is a schematic sectional view of another process chamber embodiment with a window and an electrical field source comprising an electrode behind the window.

In another version, the process chamber 35 comprises a window 130 in a wall or the ceiling 55 of the process chamber 35 and an electrical field source 220 that couples electrical energy to the window 130. The electrical energy coupled to the window 130 reduces the accumulation of the process residues on the window 130 by causing energized process gas ions to energetically bombard the window 130 and remove process residues deposited on the window. The electric field source 220 comprises an electrode 225 adjacent to the window. For example, as shown in FIG. 7, the electrical field source 220 comprises an electrode 225 disposed adjacent to and behind the window 130 to induce a charge in the window and to generate an electric field perpendicular to the plane of the window 130 which causes energetic plasma ions and species in the process chamber 35 accelerate toward and impinge upon on the window 130 to sputter-etch and remove the process residue deposits formed on the window.

In another version, shown in FIG. 8a, the electric field source 220 comprises an electrode 225 having one or more apertures 230 therein, disposed between the transparent plate 135 and the light source 150 to provide an electric field that is perpendicular to the plane of the window 130. The electrical field causes energetic plasma ions and species in the process chamber 35 accelerate toward the window 130, pass through the aperture 230, and impinge upon on the transparent plate 135 to sputter-etch and remove the process residue deposits. Preferably, the total cross-sectional area of the apertures 230 is sufficiently large to allow a sufficiently large amount of light flux to ingress and egress from the process chamber 35 through the aperture to operate the process monitoring system.

Additionally, eddy current reducing slots 232 are also sized, shaped, and disposed to reduce eddy currents induced in the electrode 225 by preventing a continuous pathway of current from being forming in the electrode. Eddy currents occur due to the electrical energy coupled from other process components, such as the inductor antenna 100. The slots 232 reduce or eliminate the eddy currents by breaking up the circular pathway of the current in the electrode 225. For example, as shown in FIG. 8b, the electrode 225 can comprise a disc 235 having at least one radially extending cutout 240 that is in the pathway of the eddy current induced in the electrode 225. Alternatively, as shown in FIGS. 8c and 8d, the electrode 225 comprises a series of radial wedge-shaped cuts 242 or an array of circular holes 243 spaced apart from one another.

As with the magnetic field source 195, the electrical field source 220 is adapted to provide an electrical field or flux that extends across a portion of or substantially the entire surface of the window 130, and that terminates at or near the edges of the window 130. More preferably, the electrode 225 is sized sufficiently large to provide an electric field that covers the entire area of the transparent plate 135 of the window 130 and is shaped and sized similar to the shape of the window 130. A voltage source 245 electrically biases the electrode 225 with one of a D.C. voltage, an A.C. voltage, or an RF voltage. Alternatively, as shown in FIG. 8a, the electrode 225 can be electrically biased by a tap 250 connecting a selected coil of the inductor antenna 100 to the electrode 225. Thus the coil power supply 104 provides power to both the window electrode 225 and the inductor antenna 100. Preferably, coil power supply 104 biases the electrode 225 with a voltage of from about 10 to about 10,000 volts, and more preferably from about 20 to about 4000 volts.

The mask 140 can also be used in combination with the magnetic and electrical field confinement methods. In this method, the mask 140 having the aperture 145 is aligned over the aperture 215 in the magnetic yoke 210 or over the aperture 230 in the electrode 225, to align the aperture 145 to the apertures 210 or 230. The aperture 145 of the mask 140 is shaped and sized to limit or reduce access of the energized process gas into the aperture 215 of the magnetic yoke 210 to prevent deposition of process gas byproducts and other deposits on the underlying transparent plate 135. Alternatively, the aperture 145 is sized and shaped to screen out low energy plasma species and only allow highly energetic and directional plasma species into the aperture 145. The highly energetic and directional species impinge upon sidewalls of the aperture 145 and upon the surface of the transparent plate 135 to sputter-etch and remove process gas deposits that are formed thereon.

The substrate 20 and process of the present invention allows accurate and reliable monitoring of the process being conducted in the process chamber 35 without excessive deposition of residues and deposits on the window 130 for the process monitoring system 25. The improved window 130 structure further reduces flaking of deposits from window components and thereby increases substrate yields. The window 130 is also much less susceptible to erosive damage from the plasma in the process chamber 35 than conventional windows 130. By reducing the need to often replace the window 130, the cost of operating the process chamber 35 and the cost per substrate 30 are also significantly reduced. Furthermore, the masked window 130 configuration allows use of the process chamber 35 over an extended period of time without stopping processing to wet clean the process chamber walls and components including the window 130, thereby increasing etching throughput and further reducing costs per substrate 30. The magnetic and electrical field confinement methods, can operate separately or in combination with the masking method, to reduce to entirely eliminate process residue deposition on the window.

The etching and endpoint detection method of the present invention significantly improve substrate yields by reducing etching or other damage of the thin gate oxide underlayer, during etching of an overlying polysilicon layer. In particular, the polysilicon etching process is stopped without etching through an ultra-thin gate oxide layer having a thickness of 25 to 65 angstroms, which is only a few layers of atoms of silicon dioxide, and which is 4 to 5 times thinner than prior art gate oxide layers. The etching method also minimizes the damage that a high density RF bias plasma can cause by the formation of damaging electrical currents that are coupled through the thin gate oxide layer into the silicon wafer. Also, by stopping the etching process before the thin gate oxide layer is damaged by the aggressive etching process step, the present process provides higher yields and better quality of integrated circuits.

Furthermore, the combination etching/cleaning process of the present invention has been found to uniformly etch substrates 30 while simultaneously removing etchant residues deposited on the process chamber 35 during the etching process, irrespective of the thickness or chemical stoichiometry of the etchant residue layers. Prior art etching processes required cleaning and conditioning of the process chamber 35 after processing of only 200 to 300 wafers, because of the variation in etching rates and etching selectivity ratio and the higher particle contamination levels that resulted from etchant residue deposits on the process chamber surfaces, after processing this number of wafers. Also, prior art cleaning processes, particularly those performed by an operator, often fail to uniformly clean and remove the etchant residue deposits formed on process chamber surfaces, and such build-up of etchant deposits resulted in flaking off and contamination of the substrate 30.

The present invention is described with reference to certain preferred versions thereof; however, other versions are possible. For example, the treatment and cleaning process of the present invention can be used for treating process chambers 35 for other applications, as would be apparent to one of ordinary skill. For example, the process can be applied, as would be apparent to one of ordinary skill in the art, to treat sputtering chambers, ion implantation chambers, or deposition chambers, or in combination with other cleaning processes. Therefore, the spirit and scope of the appended claims should not be limited to the description of the preferred versions contained herein.

What is claimed is:

1. A process chamber capable of processing a substrate, the process chamber comprising:
   (a) a support;
   (b) a gas distributor;
   (c) a gas energizer;
   (d) a radiation transmitting portion capable of transmitting radiation to or from the process chamber during processing of a substrate;
   (e) electromagnetic means for reducing deposition of process residue on the radiation transmitting portion absent a heating element for heating the radiation transmitting portion; and
   (f) an exhaust,
      whereby a substrate held on the support may be processed by process gas distributed by the gas distributor, energized by the gas energizer, and exhausted by the exhaust, and the electromagnetic means for reducing deposition of process residue on the radiation transmitting portion allows radiation to be transmitted through the radiation transmitting portion to monitor processing of the substrate.

2. The process chamber of claim 1 wherein the electromagnetic means for reducing deposition of process residue comprises means for limiting access of energized process gas to the radiation transmitting portion.

3. The process chamber of claim 1 wherein the electromagnetic means for reducing deposition of process residue further comprises masking means for making the energized process gas from the radiation transmitting portion.

4. The process chamber of claim 1 wherein the means for reducing deposition of process residue comprises a mask covering the radiation transmitting portion, the mask having apertures with an aspect ratio of from about 0.25:1 to about 12:1.

5. The process chamber of claim 1 further comprising a process monitoring system that is adapted to monitor radiation transmissions passing through the radiation transmitting portion.

6. A process chamber capable of processing a substrate, the process chamber comprising:
   (a) a support;
   (b) a gas distributor;
   (c) a gas energizer;
   (d) a window in a wall of the process chamber;
   (e) a magnetic field source adapted to provide a magnetic flux across the window; and
   (f) an exhaust;
      whereby a substrate held on the support may be processed by an energized process gas thereby forming process residues in the process chamber, and whereby the magnetic flux across the window reduces the deposition of the process residues on the window.

7. The process chamber of claim 6 wherein the magnetic field source provides a magnetic flux having higher density across the window than across other portions of the chamber.

8. The process chamber of claim 6 wherein the magnetic field source comprises one or more magnetic poles disposed about a perimeter of the window.

9. The process chamber of claim 8 wherein the magnetic poles face one another around the perimeter of the window and comprise opposing magnetic polarities.

10. The process chamber of claim 6 wherein the magnetic field source comprises an aperture and provides a magnetic field across the aperture.

11. The process chamber of claim 6 wherein the magnetic field source comprises at least one magnet or electromagnet adjacent to the window.

12. The process chamber of claim 6 wherein the magnetic field source comprises a hole sized to allow radiation to pass through the window.

13. The process chamber of claim 6 wherein the magnetic field source is capable of providing a magnetic field component that is substantially parallel to the plane of the window.

14. The process chamber of claim 6 wherein the magnetic field source is adapted to provide a magnetic field that extends across substantially an entire surface of the window.

15. The process chamber of claim 6 wherein the magnetic field source is adapted to provide a magnetic field that terminates at about the edges of the window.

16. The process chamber of claim 6 wherein the magnetic field source is capable of providing a magnetic field of from about 10 to about 10,000 Gauss.

17. The process chamber of claim 6 further comprising a mask covering the window, the mask comprising an aperture that allows radiation to pass through.

18. The process chamber of claim 6 further comprising a process monitoring system adapted to monitor radiation transmissions passing through the window.

19. A process chamber capable of processing a substrate, the process chamber comprising:
   (a) a support;
   (b) a gas distributor;

(c) a gas energizer;

(d) a window in a wall of the process chamber;

(e) an electrical field source that couples electrical energy to the window; and (f) an exhaust;

whereby a substrate held on the support may be processed by an energized process gas thereby forming process residues in the process chamber, and whereby the electrical energy coupled to the window reduces deposition of the process residues on the window.

20. The process chamber of claim 19 wherein the electrical field source is capable of electrically biasing the window.

21. The process chamber of claim 19 wherein the electrical field source is adapted to provide an electrical field that extends across a surface of the window and terminates at about the edges of the window.

22. The process chamber of claim 19 wherein the electrical field source comprises an electrode or coil adjacent to the window.

23. The process chamber of claim 22 wherein the electrode or coil provides an electrical flux having an electrical field component that is perpendicular to the plane of the window.

24. The process chamber of claim 22 wherein the process chamber further comprises an inductor antenna and the electrode comprises apertures positioned to reduce eddy currents induced by electrical energy coupled from the inductor antenna.

25. The process chamber of claim 22 wherein the electrode comprises an aperture sized to allow radiation to pass therethrough.

26. The process chamber of claim 22 wherein the electrode comprises a disc having at least one radially extending slot.

27. The process chamber of claim 19 wherein the process chamber further comprises an electrical current source capable of powering the electrical field source with D.C., A.C., or RF energy.

28. The process chamber of claim 27 wherein the electrical current source comprises an inductor coil and a tap connecting the inductor coil to the electrode.

29. The process chamber of claim 27 wherein the electrical current source biases an electrode with a voltage of from about 20 to about 4000 volts.

30. The process chamber of claim 19 further comprising a process monitoring system adapted to monitor radiation transmissions passing through the window.

31. A process chamber capable of processing a substrate, the process chamber comprising:

(a) a support;

(b) a gas distributor to provide a process gas in the chamber;

(c) a wall about the support;

(d) a gas energizer adapted to couple RF energy through the wall to energize the process gas, the gas energizer comprising at least one of an inductor antenna or process electrodes;

(e) a magnetic field source adapted to provide a magnetic flux across a portion of the wall, the magnetic flux selected to be sufficiently high to reduce a deposition of process residues on the portion of the wall; and (f) an exhaust capable of exhausting the process gas from the chamber;

whereby a substrate held on the support may be processed by the energized process gas thereby forming the process residues in the process chamber, and whereby the magnetic flux across the wall reduces the deposition of the process residues on the wall.

32. The process chamber of claim 31 wherein the magnetic field source provides a magnetic flux having higher density across the wall than across other portions of the chamber.

33. The process chamber of claim 31 wherein the magnetic field source comprises one or more magnetic poles disposed about a portion of the wall.

34. The process chamber of claim 33 comprising magnetic poles of opposing magnetic polarities.

35. The process chamber of claim 31 wherein the magnetic field source comprises an aperture and provides a magnetic field across the aperture.

36. The process chamber of claim 31 wherein the magnetic field source comprises at least one magnet or electromagnet adjacent to the wall.

37. The process chamber of claim 31 wherein the magnetic field source comprises a hole sized to allow radiation to pass through the wall.

38. The process chamber of claim 31 wherein the magnetic field source is capable of providing a magnetic field component that is parallel to a plane of the wall.

39. The process chamber of claim 31 wherein the magnetic field source is adapted to provide a magnetic field that extends across substantially an entire surface of the wall.

40. The process chamber of claim 31 wherein the magnetic field source is capable of providing a magnetic field of from about 10 to about 10,000 Gauss.

41. The process chamber of claim 31 further comprising a mask covering a portion of the wall, the mask comprising an aperture that allows radiation to pass through.

42. The process chamber of claim 31 wherein the portion of the wall is capable of transmitting radiation to or from the chamber, and further comprising a process monitoring system adapted to monitor radiation transmissions passing through the portion of the wall.

43. A process chamber capable of processing a substrate, the process chamber comprising:

(a) a support;

(b) a gas distributor to provide a process gas in the chamber;

(c) a gas energizer to energize the process gas;

(d) a wall about the support;

(e) an electrical field source to couple electrical energy to a portion of the wall to reduce a deposition of process residues on the portion of the wall; and (f) an exhaust capable of exhausting the process gas from the chamber;

whereby a substrate held on the support may be processed by the energized process gas thereby forming process residues in the process chamber, and whereby the electrical energy coupled to the wall reduces the deposition of the process residues on the wall.

44. The process chamber of claim 43 wherein the electrical field source electrically biases the wall.

45. The process chamber of claim 43 wherein the electric field source comprises an electrode or coil adjacent to the wall.

46. The process chamber of claim 45 wherein the electrode or coil provides an electrical flux having an electrical field component that is perpendicular to a plane of the wall.

47. The process chamber of claim 43 wherein the process chamber further comprises an antenna.

48. The process chamber of claim 47 wherein the electrical field source comprises an electrode.

49. The process chamber of claim 43 wherein the electrical field source comprises an electrode.

50. The process chamber of claim 49 wherein the electrode comprises apertures positioned to reduce eddy currents induced by electrical energy coupled from the antenna.

51. The process chamber of claim 49 wherein the electrode comprises an aperture sized to allow radiation to pass therethrough.

52. The process chamber of claim 49 wherein the electrode comprises a disc having at least one radially extending slot.

53. The process chamber of claim 43 further comprising an electrical current source capable of powering the electrical field source with D.C., A.C., or RF energy.

54. The process chamber of claim 53 wherein the electrical current source comprises a coil and a tap connecting the coil to the electrode.

55. The process chamber of claim 53 wherein the electrical current source biases an electrode with a voltage of from about 20 to about 4000 volts.

56. The process chamber of claim 43 wherein the portion of the wall is capable of transmitting radiation to or from the chamber, and further comprising a process monitoring system adapted to monitor radiation transmissions passing through the portion of the wall.

57. A process chamber capable of processing a substrate, the process chamber comprising:
  (a) a support;
  (b) a gas distributor;
  (c) a gas energizer;
  (d) a window in a wall of the process chamber;
  (e) a process monitoring system adapted to monitor radiation transmissions passing through the window;
  (f) a magnetic field source adapted to provide a magnetic flux across the window; and
  (g) an exhaust;
    whereby a substrate held on the support may be processed by an energized process gas thereby forming process residues in the process chamber, and whereby the magnetic flux across the window reduces the deposition of the process residues on the window.

58. The process chamber of claim 57 wherein the magnetic field source comprises one or more magnetic poles disposed about a perimeter of the window.

59. The process chamber of claim 57 wherein the magnetic field source comprises at least one magnet or electromagnet adjacent to the window.

60. The process chamber of claim 57 wherein the magnetic field source is adapted to provide a magnetic field that extends across substantially an entire surface of the window.

61. The process chamber of claim 57 further comprising a mask covering the window, the mask comprising an aperture that allows radiation to pass through.

62. A process chamber capable of processing a substrate, the process chamber comprising:
  (a) a support;
  (b) a gas distributor;
  (c) a gas energizer;
  (d) a window in a wall of the process chamber;
  (e) a process monitoring system adapted to monitor radiation transmissions passing through the window;
  (f) an electrical field source that couples electrical energy to the window; and
  (g) an exhaust;
    whereby a substrate held on the support may be processed by an energized process gas thereby forming process residues in the process chamber, and whereby the electrical energy coupled to the window reduces deposition of the process residues on the window.

63. The process chamber of claim 62 wherein the electrical field source is capable of electrically biasing the window.

64. The process chamber of claim 62 wherein the electrical field source comprises an electrode or coil adjacent to the window.

65. The process chamber of claim 62 wherein the electrical field source comprises an electrode comprising a disc having a radially extending slot.

66. The process chamber of claim 62 wherein the electrical field source is adapted to provide an electrical field that extends across substantially an entire surface of the window.

* * * * *